United States Patent [19]

Iwasa et al.

[11] Patent Number: 5,848,087
[45] Date of Patent: Dec. 8, 1998

[54] TWO-DIMENSIONAL SURFACE EMITTING LASER ARRAY, TWO-DIMENSIONAL SURFACE EMITTING LASER BEAM SCANNER, TWO-DIMENSIONAL SURFACE EMITTING LASER BEAM RECORDER, AND TWO-DIMENSIONAL SURFACE EMITTING LASER BEAM RECORDING METHOD

[75] Inventors: Izumi Iwasa; Shigeyuki Otake; Akira Sakamoto; Masateru Yamamoto, all of Ebina, Japan

[73] Assignee: Fuji Xerox Co., Ltd., Tokyo, Japan

[21] Appl. No.: 766,361

[22] Filed: Dec. 17, 1996

[30] Foreign Application Priority Data

Jan. 23, 1996 [JP] Japan .................................... 8-008878

[51] Int. Cl.⁶ ........................................................ H01S 3/10
[52] U.S. Cl. .............................................. 372/50; 372/24
[58] Field of Search ....................... 372/50, 24, 108–101; 369/44, 37, 97; 346/107 R; 359/385

[56] References Cited

U.S. PATENT DOCUMENTS

| | | | |
|---|---|---|---|
| 5,300,956 | 4/1994 | Ohta et al. | 346/107 R |
| 5,325,386 | 6/1994 | Jewell et al. | 372/50 |
| 5,483,511 | 1/1996 | Jewell et al. | 369/44.37 |
| 5,499,107 | 3/1996 | Kuroda | 358/347 |
| 5,506,719 | 4/1996 | Murakami et al. | 359/216 |
| 5,524,105 | 6/1996 | Brewen et al. | 369/97 |
| 5,600,666 | 2/1997 | Hiiro | 372/24 |
| 5,691,839 | 11/1997 | Kobayashi | 359/385 |

FOREIGN PATENT DOCUMENTS

| | | |
|---|---|---|
| A-64-42667 | 2/1989 | Japan . |
| A-1-152683 | 6/1989 | Japan . |
| A-2-147259 | 6/1990 | Japan . |
| A-7-314771 | 12/1995 | Japan . |
| A-7-329352 | 12/1995 | Japan . |

*Primary Examiner*—Rodney Bovernick
*Assistant Examiner*—Ellen E. Kang
*Attorney, Agent, or Firm*—Oliff & Berridge PLC

[57] ABSTRACT

A plurality of lasers (having openings 170) are formed at predetermined positions at equal intervals on at least two main scanning lines on a semiconductor substrate 100. The lasers have each a predetermined beam diameter and take different positions in the main scanning direction, thereby providing a two-dimensional surface emitting laser array emitting laser beams through a lens system to form a pixel line with no gap on the main scanning line of an image formation face moving in the sub-scanning direction. The two-dimensional surface emission laser array is used to provide a laser beam scanner, a laser beam recorder, and a laser beam recording method.

16 Claims, 18 Drawing Sheets

TWO-DIMENSIONAL SURFACE EMITTING LASER ARRAY, TWO-DIMENSIONAL SURFACE EMITTING LASER BEAM SCANNER, TWO-DIMENSIONAL SURFACE EMITTING LASER BEAM RECORDER, AND TWO-DIMENSIONAL SURFACE EMITTING LASER BEAM RECORDING METHOD

BACKGROUND OF THE INVENTION

This invention relates to a two-dimensional surface emitting laser array, a two-dimensional surface emitting laser beam scanner, a two-dimensional surface emitting laser beam recorder, and a two-dimensional surface emitting laser beam recording method and in particular to a two-dimensional surface emitting laser array, a two-dimensional surface emitting laser beam scanner, a two-dimensional surface emitting laser beam recorder, and a two-dimensional surface emitting laser beam recording method capable of forming laser spots brought into intimate contact with each other on an image formation plane, mainly, on a photosensitive body with high accuracy.

A conventional two-dimensional surface emitting laser array is described in U.S. Pat. No. 5,325,386, for example. This two-dimensional surface emitting laser array comprises a predetermined two-dimensional pattern of lasers on a semiconductor substrate and a microlens is formed on each laser as required.

With the two-dimensional surface emitting laser array, the lasers are driven in response to an image signal and laser light emitted from the lasers is scanned in a main scanning direction or main and sub scanning directions by a scan mirror, thereby generating a two-dimensional visible image pattern.

On the other hand, a conventional semiconductor laser beam scanner is described in the Unexamined Japanese Patent Application Publication No. Hei 1-152683, for example. This semiconductor laser beam scanner has a semiconductor laser array comprising lasers arranged on one dimension and a lens system for gathering laser light emitted from the semiconductor laser array to a light exposure position, and an image formation plane of bar code, etc., is placed at the light exposure position.

A conventional laser beam printer is described in the Unexamined Japanese Patent application Publication No. Sho 64-42667, for example. This laser beam printer consists of a semiconductor laser array comprising semiconductor substrates stuck on each other and lasers arranged over the width in the main scanning direction of a recording substance and a photosensitive body placed in the proximity of the semiconductor laser array and exposed directly to laser light of the lasers.

However, according to the two-dimensional surface emitting laser array described in U.S. Pat. No. 5,325,386, laser light is scanned by the scan mirror, thus a failure is prone to occur in the scan mirror system and noise occurs. On the other hand, if a photosensitive body is exposed directly to the laser light, high-quality image recording with no space between pixels cannot be performed because the lasers are spaced from each other.

According to the semiconductor laser beam scanner shown in the Unexamined Japanese Patent application Publication No. Hei 1-152683, the lasers of the semiconductor laser array are spaced from each other on the semiconductor substrate, thus a space occurs between pixels of an image formed on a photosensitive body and improvement in the image quality is limited.

Further, the laser beam printer shown in the Unexamined Japanese Patent Application Publication No. Sho 64-42667has the semiconductor laser array comprising semiconductor substrates stuck on each other, thus pixel array position accuracy lowers in addition to the pixel-to-pixel space problem described above.

SUMMARY OF THE INVENTION

It is therefore an object of the invention to provide a two-dimensional surface emitting laser array, a two-dimensional surface emitting laser beam scanner, a two-dimensional surface emitting laser beam recorder, and a two-dimensional surface emitting laser beam recording method without the scan mirror system which causes a failure and generates noise.

It is another object of the invention to provide a two-dimensional surface emitting laser array, a two-dimensional surface emitting laser beam scanner, a two-dimensional surface emitting laser beam recorder, and a two-dimensional surface emitting laser beam recording method capable of an image with no space between pixels.

It is a further object of the invention to provide a two-dimensional surface emitting laser array, a two-dimensional surface emitting laser beam scanner, a two-dimensional surface emitting laser beam recorder, and a two-dimensional surface emitting laser beam recording method having high position accuracy.

To these ends, according to a first aspect of the invention, there is provided a two-dimensional surface emitting laser array comprising a first laser array having a plurality of lasers placed in a first predetermined spacing along a first base line extending in the main scanning direction on a single semiconductor substrate and at least a second laser array having a plurality of lasers placed along at least a second base line having a second predetermined spacing with the first base line in the sub scanning direction and extending in parallel with the first base line on the single semiconductor substrate, wherein the lasers of the first laser array and the lasers of at least the second laser array are placed at different positions in the main scanning direction along the first base line and at least the second base line so as to form an array of pixels equally spaced from each other and with no gap in the main scanning direction. To the ends, according to a second aspect of the invention, there is provided a two-dimensional surface emitting laser array comprising a first group of lasers placed in a predetermined spacing on a base line extending in a predetermined direction on a single semiconductor substrate and a second group of lasers placed in a predetermined spacing on a plurality of inclined lines extending and forming a predetermined angle with the first base line on the single semiconductor substrate, wherein the lasers of the first and second groups are placed so as to be equally spaced from each other and with no gap in the direction of the base line.

To these ends, according to a third aspect of the invention, there is provided a two-dimensional surface emitting laser beam scanner comprising a two-dimensional surface emitting laser array having a plurality of lasers placed two-dimensionally on a semiconductor substrate, a lens system being placed on the emission side of the two-dimensional surface emitting laser array and having a diameter for receiving all laser light emitted from the lasers, and a drive circuit for driving the lasers of the two-dimensional surface emitting laser array in response to a specified scanning pattern.

To these ends, according to a fourth aspect of the invention, there is provided a two-dimensional surface emitting laser beam recorder comprising a two-dimensional surface emitting laser array having a plurality of lasers placed two-dimensionally on a semiconductor substrate, a lens system being placed on the emission side of the two-dimensional surface emitting laser array and having a diameter for receiving all laser light emitted from the lasers, a drive circuit for driving the lasers of the two-dimensional surface emitting laser array in response to a specified scanning pattern, a photosensitive body rotating at a predetermined speed in the sub scanning direction and being exposed to the laser light passed through the lens system for forming an electrostatic latent image, and record means for executing image recording based on the electrostatic latent image.

To these ends, according to a fifth aspect of the invention, there is provided a two-dimensional surface emitting laser beam recording method comprising the steps of preparing a two-dimensional surface emitting laser array having a plurality of lasers placed two-dimensionally on a semiconductor substrate, driving the lasers of the two-dimensional surface emitting laser array in response to a specified scanning pattern for emitting laser light from the lasers, exposing a photosensitive body to the laser light through a lens system having a diameter for receiving all laser light emitted from the lasers for forming an electrostatic latent image on the photosensitive body in response to an exposure pattern, and executing image recording based on the electrostatic latent image.

DETAILED DESCRIPTION OF THE PREFERRED EMBODIMENTS

Referring now to the accompanying drawings, there are shown preferred embodiments of the invention.

Figure 1:
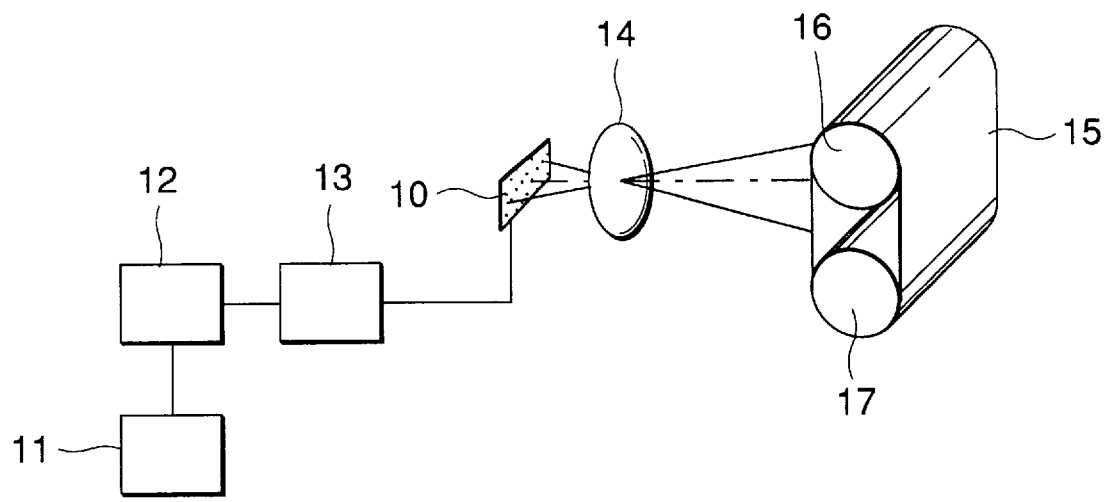
FIG. 1 is an illustration to show a first embodiment of a two-dimensional surface emitting laser beam recorder of the invention.

FIG. 1 shows a first embodiment of a two-dimensional surface emitting laser beam recorder of the invention. The two-dimensional surface emitting laser beam recorder has a memory 11 for storing pixel signals, a signal processing section 12 for processing an image signal read from the memory 11 and outputting a record signal responsive to a record pattern, a drive circuit 13 for inputting the record signal from the signal processing section 12 and outputting a drive signal for driving a two-dimensional surface emitting laser array (simply, laser array) 10, an optical system 14 for enlarging laser light emitted from the laser array 10 in the main and sub scanning directions, and a photosensitive belt 15 supported by support rolls 16 and 17 (at least either of them is a drive roll) for rotation and electrostatically charged, then exposed to laser light from the laser array 10 via the optical system 14, thereby forming an electrostatic latent image on the surface of the photosensitive belt. The photosensitive belt 15 is surrounded by a charger, a developing machine, a transfer device, etc., and the transfer device is preceded by a paper feed section and is followed by a fuser, a paper discharge section, etc. These units are not shown in the figure for description.

Figure 2:
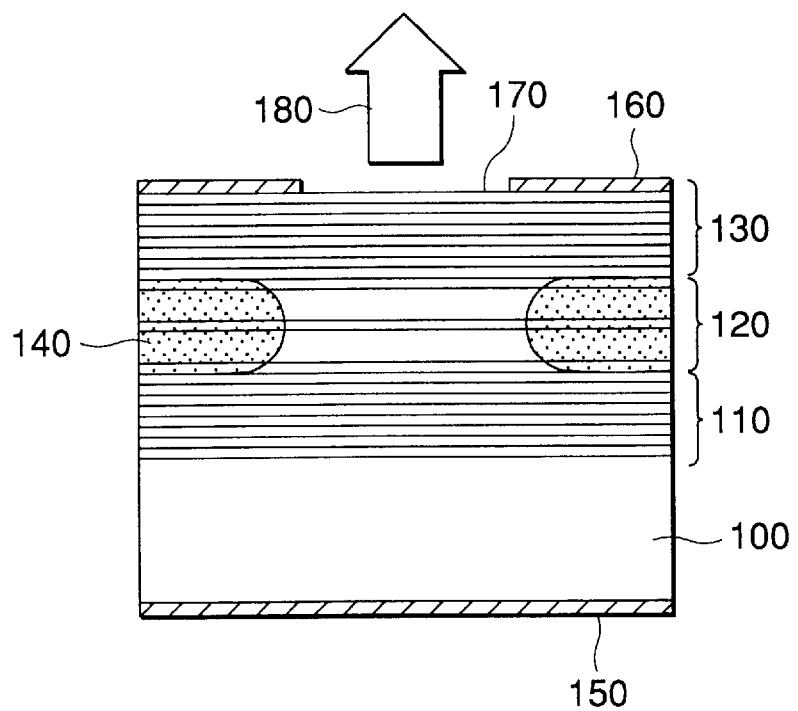
FIG. 2 is a sectional view to show a laser of a two-dimensional surface emitting laser array in the first embodiment of the two-dimensional surface emitting laser beam recorder of the invention.

FIG. 2 shows one of laser elements making up the laser array 10 in FIG. 1. The laser has an n-GaAs semiconductor substrate 100, an n-type reflecting mirror layer 110 comprising $Al_{0.15}Ga_{0.85}As$ and AlAs laminated alternately on each other, a cavity region 120 containing a light emission layer comprising a GaAs quantum well layer sandwiched between upper and lower $Al_{0.3}Ga_{0.7}As$, a p-type reflecting mirror layer 130 comprising $Al_{0.15}Ga_{0.85}As$ and AlAs laminated alternately on each other, a proton-injected high-resistance region 140, an n-type electrode 150 formed on the rear face of the semiconductor substrate 100, and a p-type electrode 160 formed on the surface of the p-type reflecting mirror 130. The p-type electrode 160 is formed with an opening 170 for emitting laser light 180 from the surface of the p-type mirror 130.

Figure 3:
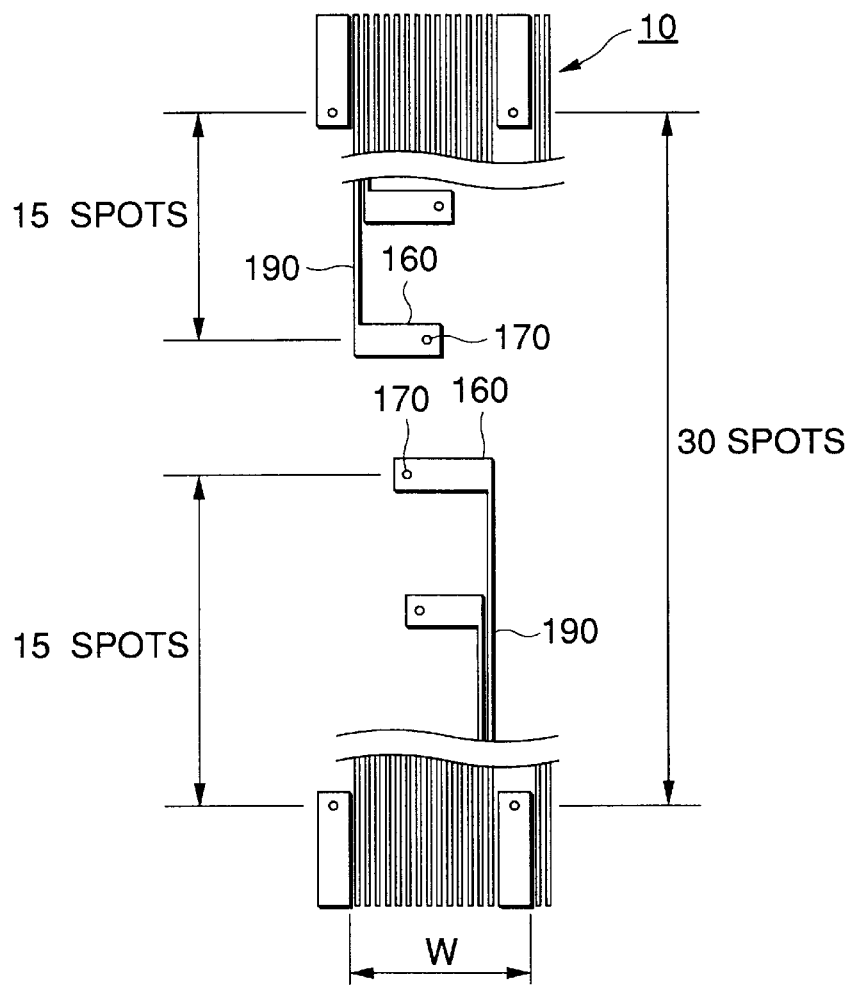
FIG. 3 is an illustration to show the relationship between laser light emission openings and wiring in a two-dimensional surface emitting laser array in the first embodiment of the two-dimensional surface emitting laser beam recorder of the invention.

FIG. 3 shows a part of the laser array 10. The p-type electrodes 160 connected to a power source (not shown) by wiring 190 are placed in a predetermined pattern and each p-type electrode 160 is formed with an opening 170 for emitting laser light.

Figure 4:
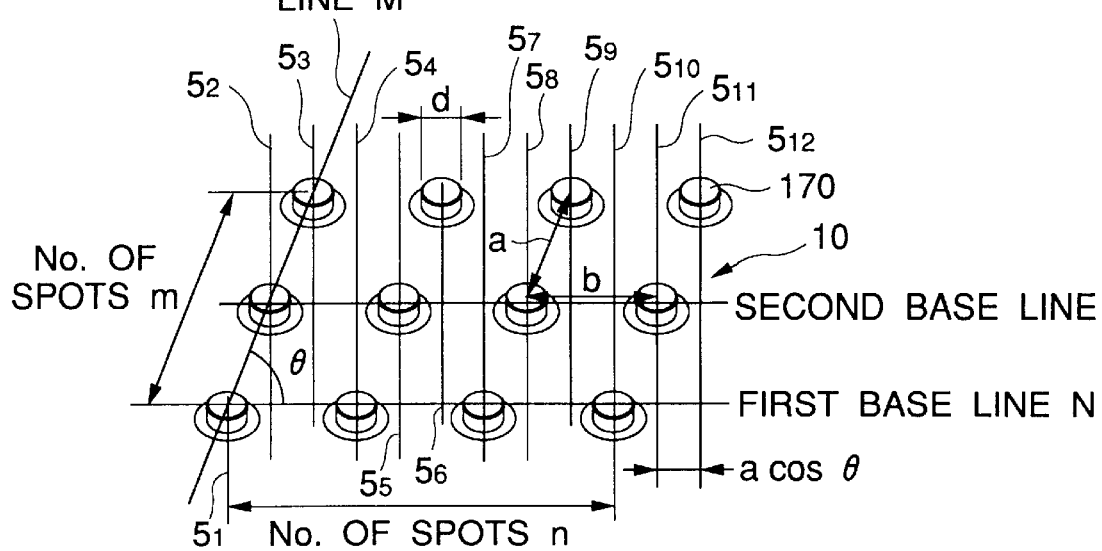
FIG. 4 is an illustration to show a placement pattern of laser light emission openings of the two-dimensional surface emitting laser array in the first embodiment of the two-dimensional surface emitting laser beam recorder of the invention.

FIG. 4 shows a pattern of the openings 170 of the laser array 10. The pattern of the openings 170 is defined by a base line N in the main direction (first base line) and an inclined line M forming angle θ with the base line N and passing through on the lasers on the base line N. Only one inclined line M is shown although n inclined lines can be defined for n lasers. The lasers with the openings 170 are formed on a single semiconductor substrate; n lasers are equally spaced from each other along the base line N and m lasers are equally spaced from each other along the inclined line M, namely, a total of n×m lasers are placed two-dimensionally. The opening 170 of each laser has a diameter d. The openings 170 are spaced with a spacing a along the inclined line M and with a spacing b along the base line N. Reference numerals $5_1$–$5_{12}$ denote sub scanning lines, which are spaced with a spacing a cosθ. The opening 170 is formed so that the diameter d satisfies the relation d≧a cosθ. At least one opening 170 is formed on the sub scanning lines $5_1$–$5_{12}$. The spacing between the openings 170 in the main scanning direction, b, satisfies a relation b=ma cosθ.

Figure 5:
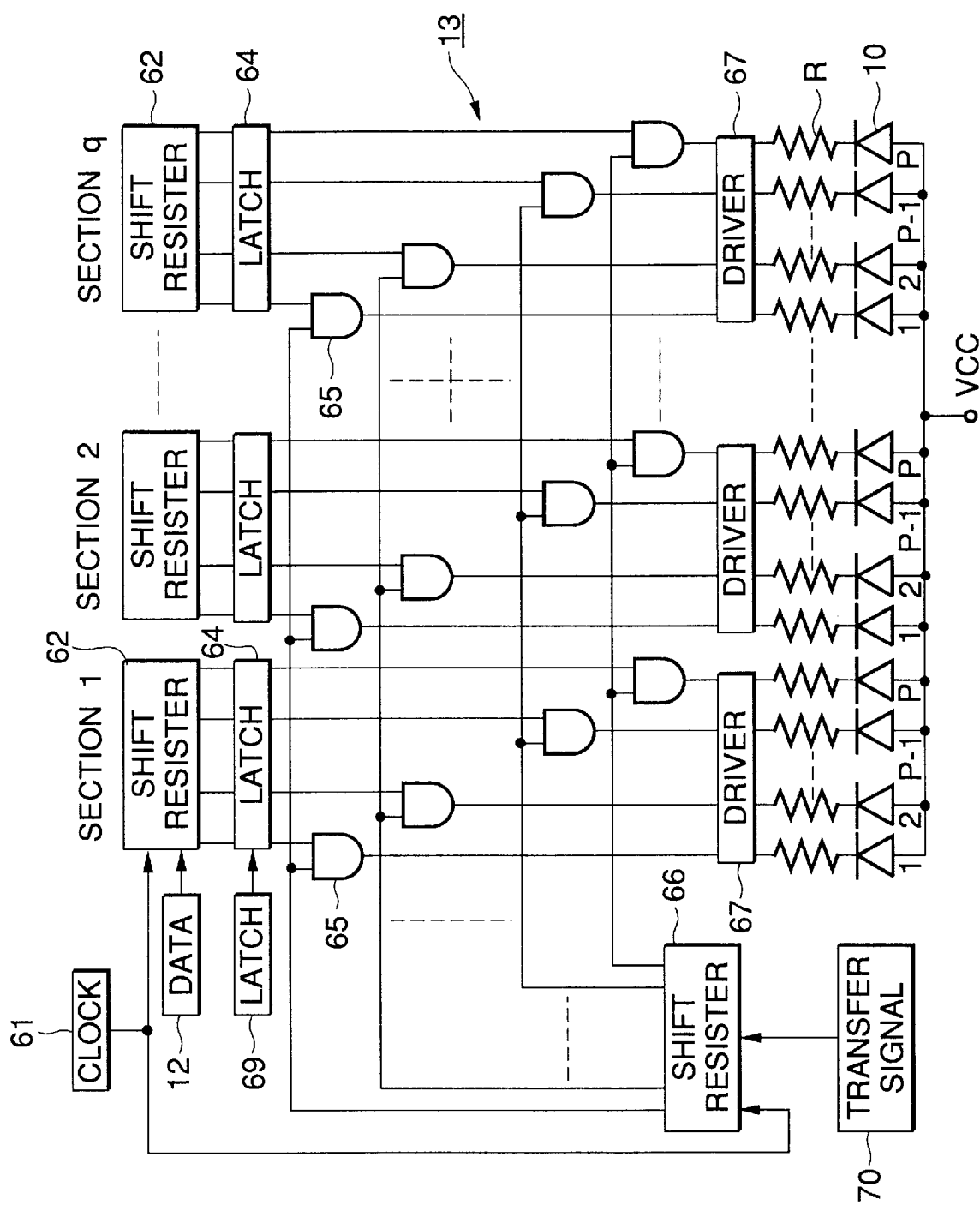
FIG. 5 is a block diagram to show a laser array drive circuit in the first embodiment of the two-dimensional surface emitting laser beam recorder of the invention.

FIG. 5 shows the drive circuit 13 in FIG. 1, which is connected to the laser array 10 via resistors R. The laser array 10 has lasers formed two-dimensionally on a single semiconductor substrate. Each laser is divided into sections 1-q (for example, q=14) each formed with p (for example p=1000) lasers. For q and p, a relation q×p=n×m is satisfied in conjunction with n and m described above. Each section has a shift register 62 for inputting a serial record signal from the signal processing circuit 12 based on a clock of a clock generation circuit 61 and outputting the record signal in parallel, a latch circuit 64 for inputting the parallel record signal from the shift register 62 and latching the signal by a latch signal from a latch signal generation circuit 69, a shift register 66 for shifting a transfer signal from a transfer signal generation circuit 70 one bit at a time based on a clock input from the clock generation circuit 61 and placing one of the AND circuits 65 corresponding to the bit in a through state, and a driver 67 for inputting the record signal from the latch circuit 64 via the AND circuit 65 turned on and driving the laser array 10 based on a power supply voltage Vcc.

Figure 6:
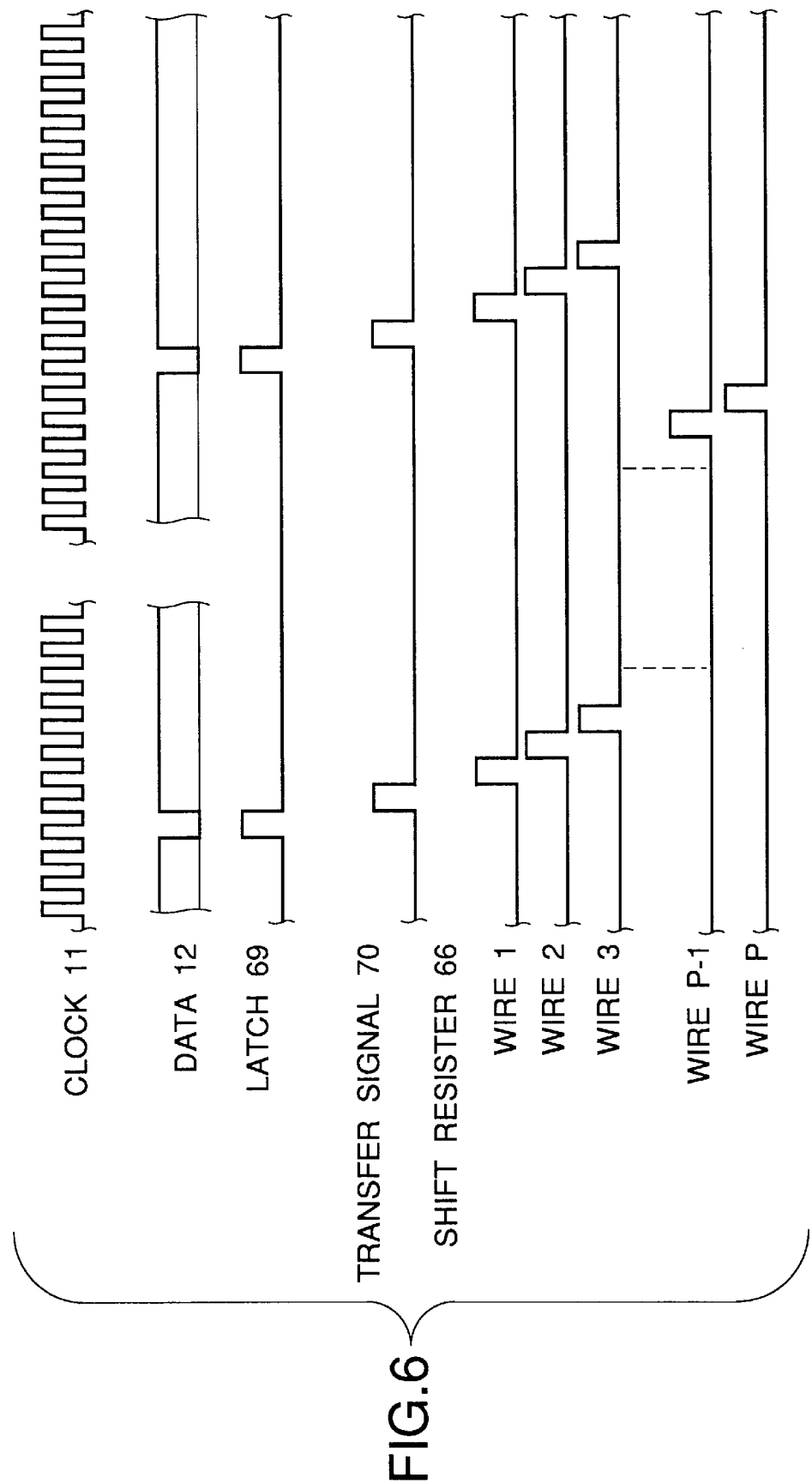
FIG. 6 is a timing chart to show driving the laser array in the first embodiment of the two-dimensional surface emitting laser beam recorder of the invention.

In the configuration, the operation will be discussed with reference to a timing chart in FIG. 6. First, an image signal is read from the memory 11 and is processed by the signal processing circuit 12 for generating a record signal corresponding to the image signal. The record signal (data) is output from the signal processing circuit 12 to the shift register 62 of each section in series based on a clock output from the clock signal generation circuit 61 and the shift register is shifted by one bit at a time. When the record signal is input to each bit of the shift register 62, a latch signal is output from the latch signal generation circuit 69 to the latch circuit 64 and the record signal in the shift register 62 is transferred to the latch circuit 64 in parallel and is latched therein. Next, when a transfer signal is supplied from the transfer signal generation circuit 70 to the shift register 66, it shifts the shift register 66 by one bit at a time based on the clock and places the AND circuits 65 in a through state one by one. When the AND circuits 65 enter the through state, the record signal latched in the latch circuit 64 is supplied to the driver 67, whereby the lasers of the laser array 10 are driven in response to the record signal.

When each laser of the laser array 10 receives a drive voltage based on the supply voltage Vcc between the n-type electrode 150 and the p-type electrode 160, carriers concentrate on the cavity region 120 surrounded by the high-resistance region 140 and the GaAs quantum well layer generates light. A lasing phenomenon occurs between the p-type and n-type reflecting mirror layers 110 and 130 and laser light 180 is emitted through the opening 170.

The laser light emitted through the opening 170 of the laser array 10 is enlarged at a predetermined magnification in the main and sub scanning directions by the lens system 14 and the photosensitive belt 15 is exposed to the laser light.

Figure 7A:
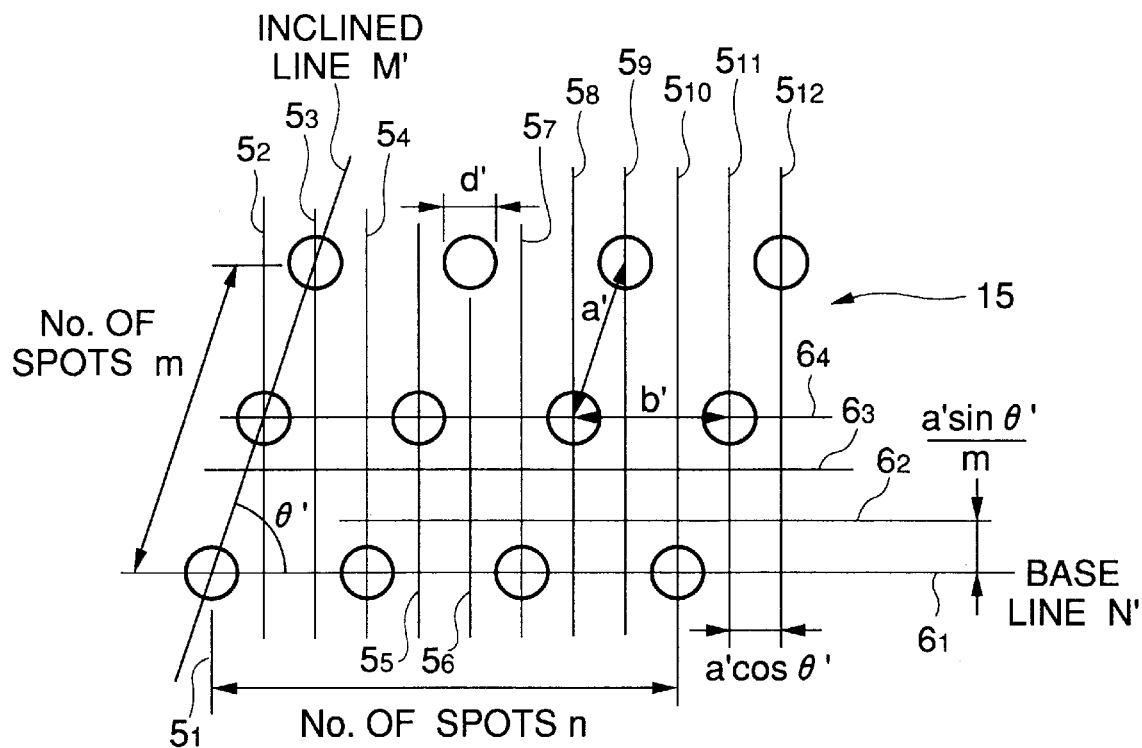
FIGS. 7A and 7B are illustrations of a pixel pattern on a photosensitive belt in the first embodiment of the two-dimensional surface emitting laser beam recorder of the invention.

FIG. 7A shows pixels (laser spots) on the photosensitive belt 15 exposed for a first time to laser light emitted by driving the lasers connected to wiring 1-p of the sections 1-q in FIG. 5. A base line N' and an inclined line M' shown in FIG. 7A correspond to the base line N and the inclined line M described above and a pixel diameter d' and pixel spacings a' and b' equal the values resulting from enlarging the diameter d of the opening 170 and spacings a and b between the openings 170 at a predetermined magnification by the lens system 14. All lasers are driven once in one cycle of the transfer signal 70. Meanwhile, the photosensitive belt 15 moves by a predetermined distance in the sub scanning direction. All lasers are again driven in the next cycle of the transfer signal 70.

Figure 7B:
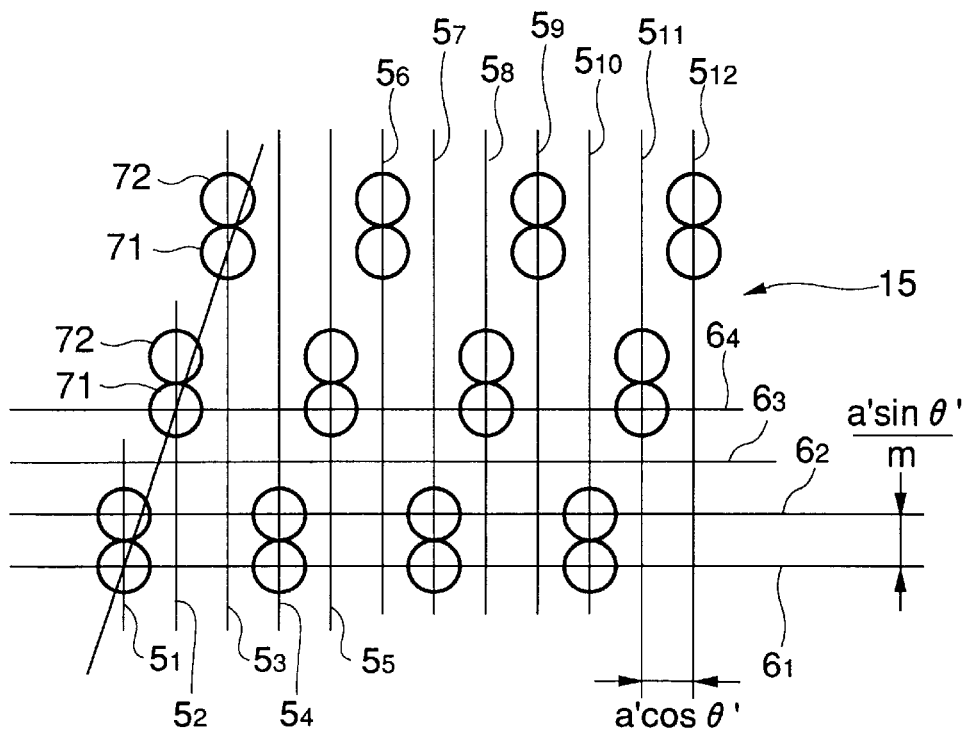

FIG. 7B shows the state. A pixel 72 is formed in the following transfer signal 70 cycle adjoining a pixel 71 formed on main scanning line $6_1$ in the preceding transfer signal 70 cycle. Pixels are thus formed one after another at the intersections of main scanning lines $6_1, 6_2, 6_3, 6_4, \ldots$ and sub scanning lines $5_1, 5_2, 5_3, 5_4, \ldots$. As a result, an electrostatic latent image responsive to the record signal is formed by pixels having no space with adjacent pixels on the surface of the photosensitive body 15. The electrostatic latent image is developed with toner to a toner image, which is then transferred to a recording substance and the transferred image undergoes a fixing process and is fixed onto the recording substance. Image recording is thus executed.

As seen from the description made so far, a high-quality image can be formed by pixels densely placed and equally spaced from each other and having no space with adjacent pixels. Since the laser array 10 is formed on a single semiconductor substrate, the position accuracy of the lasers enhances; resultantly, lowering the image quality such as due to the semiconductor laser array comprising semiconductor substrates stuck on each other can be prevented.

Figure 8A:
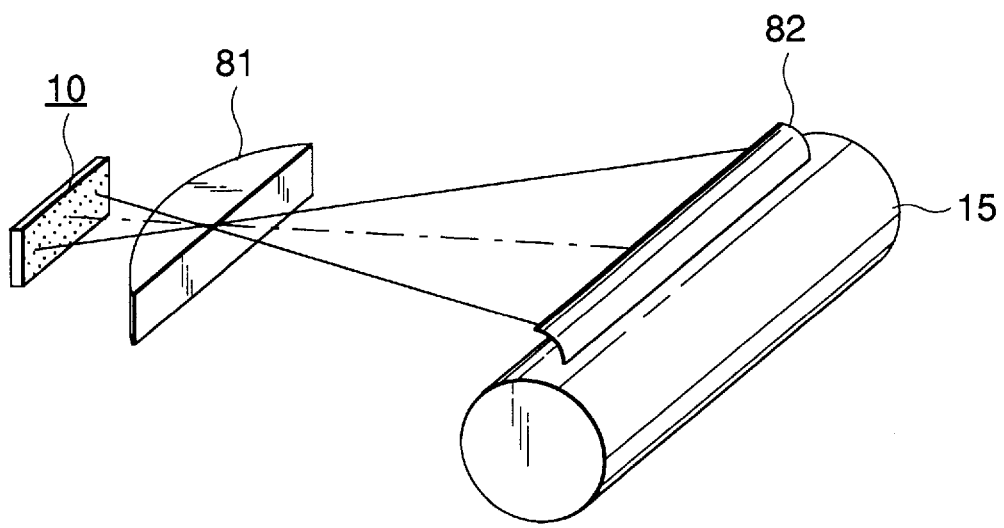
FIGS. 8A and 8B are a perspective view and a side view to show a second embodiment of the two-dimensional surface emitting laser beam recorder of the invention.
Figure 8B:
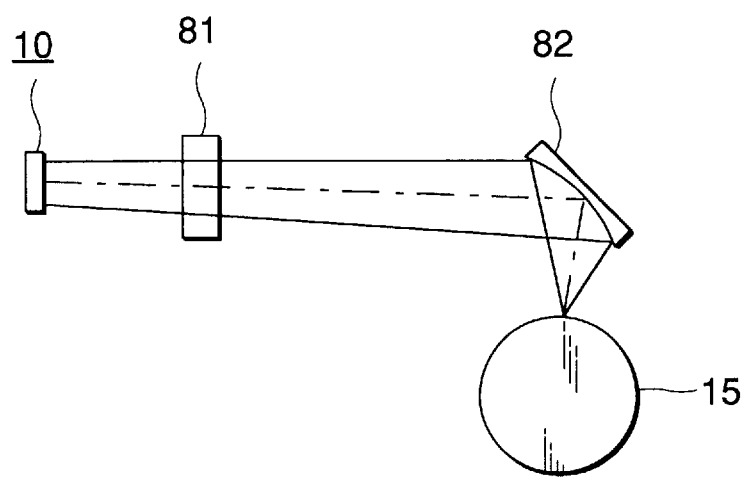

FIGS. 8A and 8B show a second embodiment of the two-dimensional surface emitting laser beam recorder of the invention. The two-dimensional surface emitting laser beam recorder has a laser array 10 being driven in response to a record signal to emit laser light, a magnifying glass 81 for enlarging laser light in the main scanning direction at a predetermined magnification, a miniaturizing mirror 82 for reducing the laser light enlarged in the main scanning direction at a predetermined reduction rate in the sub scanning direction, and a photosensitive drum 15 exposed to the laser light enlarged in the main scanning direction and reduced in the sub scanning direction. The photosensitive belt 15 is surrounded by a charger, a developing machine, a transfer device, and the like, which are not shown in the figure.

In the configuration, when the laser array 10 is driven by a record signal, it emits laser light. This laser light is enlarged by the magnifying glass 81 and reduced by the miniaturizing mirror 82, and the photosensitive drum 15 is exposed to the laser light, whereby an electrostatic latent image responsive to the record signal is formed on the drum 15 and an image is formed on a recording substance as described in the first embodiment.

Figure 9A:
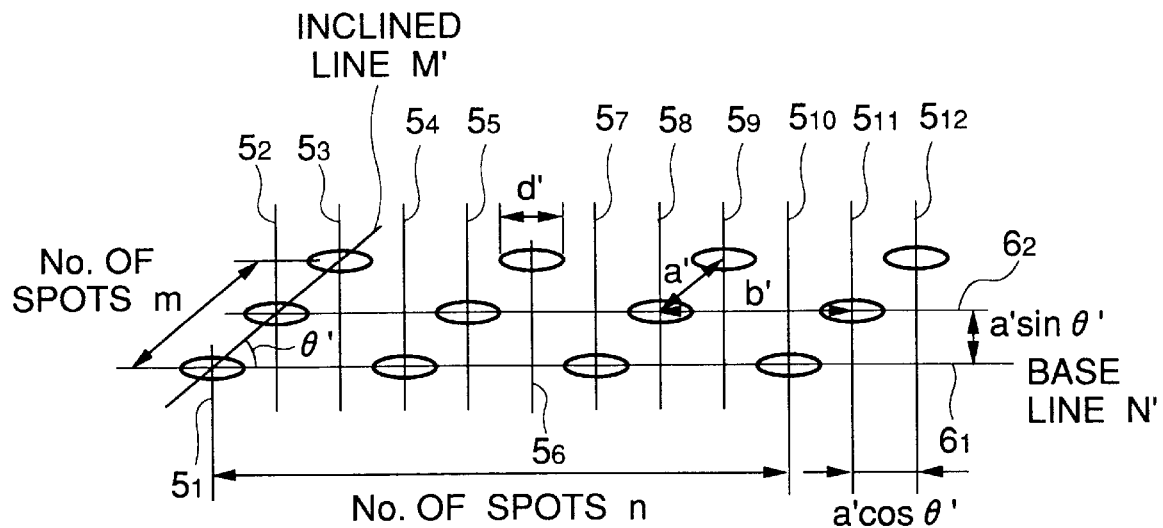
FIGS. 9A and 9B are illustrations of a pixel pattern on a photosensitive belt in the second embodiment of the two-dimensional surface emitting laser beam recorder of the invention.

FIG. 9A, which corresponds to FIG. 7A, shows pixels formed on the photosensitive drum 15. That is, pixels enlarged in the main scanning direction and reduced in the sub scanning direction are formed at the intersections of main scanning lines $6_1$, $6_2$ . . . and sub scanning lines $5_1$, $5_2$ . . .

Figure 9B:
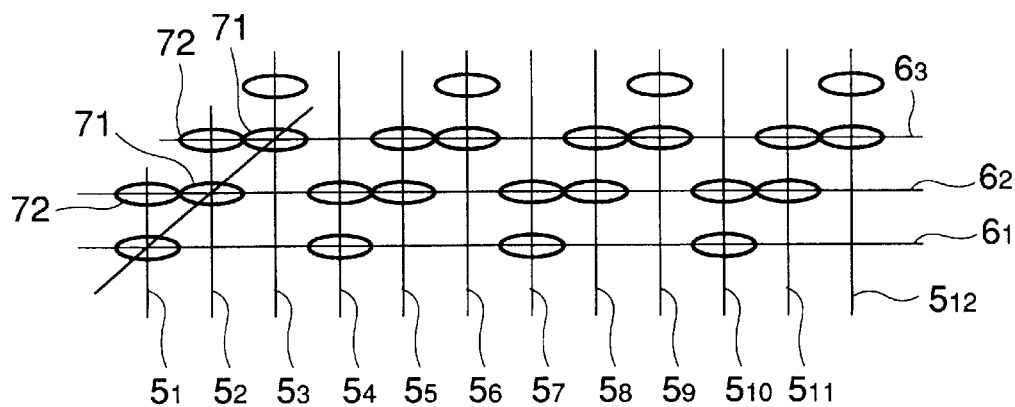

FIG. 9B, which corresponds to FIG. 7B, shows a pixel 71 formed in the preceding transfer signal cycle and a pixel 72 formed in the following transfer signal cycle.

According to the second embodiment, the width in the sub scanning direction of an image provided by projecting laser light from the laser array onto the photosensitive body is reduced, so that distortion-free images can be provided even if the photosensitive drum 15 has a small curvature radius. High-quality images can be provided as in the first embodiment. Further, the size of the pixel in the sub scanning direction can be changed by changing the lasers on time.

Figure 10A:
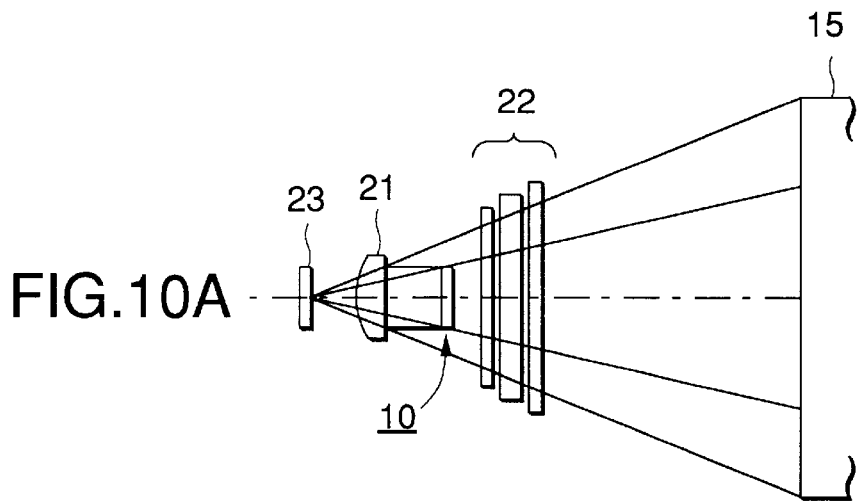
Figs. 10A and 10B are a top view and a side view to show a third embodiment of the two-dimensional surface emitting laser beam recorder of the invention.
Figure 10B:
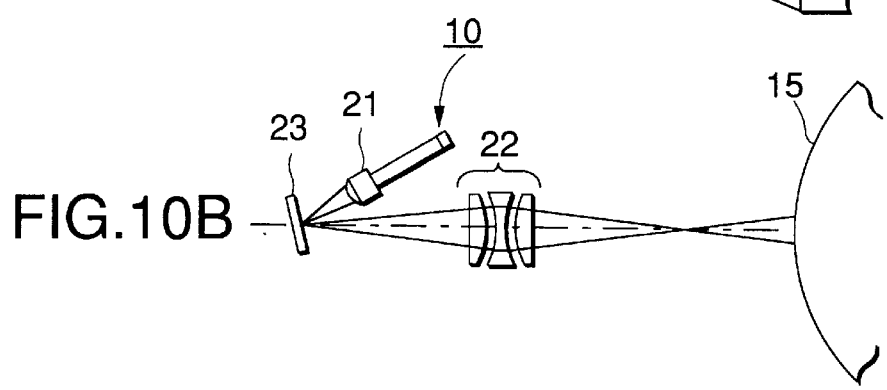

FIGS. 10A and 10B show a third embodiment of the two-dimensional surface emitting laser beam recorder of the invention. The two-dimensional surface emitting laser beam recorder has a laser array 10 driven in response to a record signal, a first optical system 21 for enlarging laser light emitted from the laser array 10 in the main and sub scanning directions, a reflecting mirror 23 for reflecting the laser light enlarged in the main and sub scanning directions, a second optical system 22 for enlarging or reducing the laser light reflected from the reflecting mirror 23 in the sub scanning direction, and a photosensitive drum 15 exposed to the laser light.

In the third embodiment, laser light is enlarged in the main and sub scanning directions through the first scanning optical system 21 made of a spherical lens and is enlarged or reduced in the sub scanning direction through the second optical system 22 made of an aspherical lens. The second optical system 22 for the sub scanning direction may be replaced with an optical system for the main scanning direction.

Figure 11A:
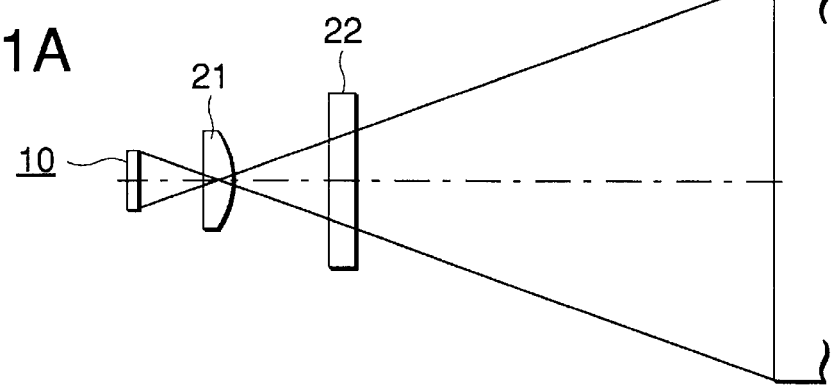
FIGS. 11A and 11B are a top view and a side view to show a fourth embodiment of the two-dimensional surface emitting laser beam recorder of the invention.
Figure 11B:
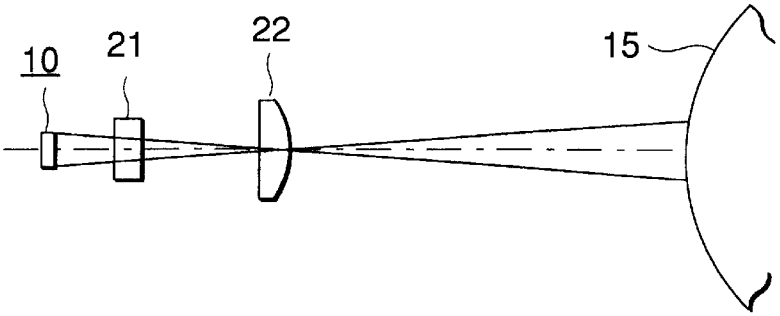

Figs. 11A and 11B show a fourth embodiment of the two-dimensional surface emitting laser beam recorder of the invention. The two-dimensional surface emitting laser beam recorder has a laser array 10 driven in response to a record signal, a first optical system 21 for enlarging laser light emitted from the laser array 10 in the main scanning direction, a second optical system 22 for enlarging the laser light enlarged in the main scanning direction in the sub scanning direction, and a photosensitive drum 15 exposed to the laser light enlarged in the main and sub scanning directions.

Various patterns of the two-dimensional surface emitting laser array of the invention will be discussed:

(a) Basic layout (10 vertical spots)

Figure 12:
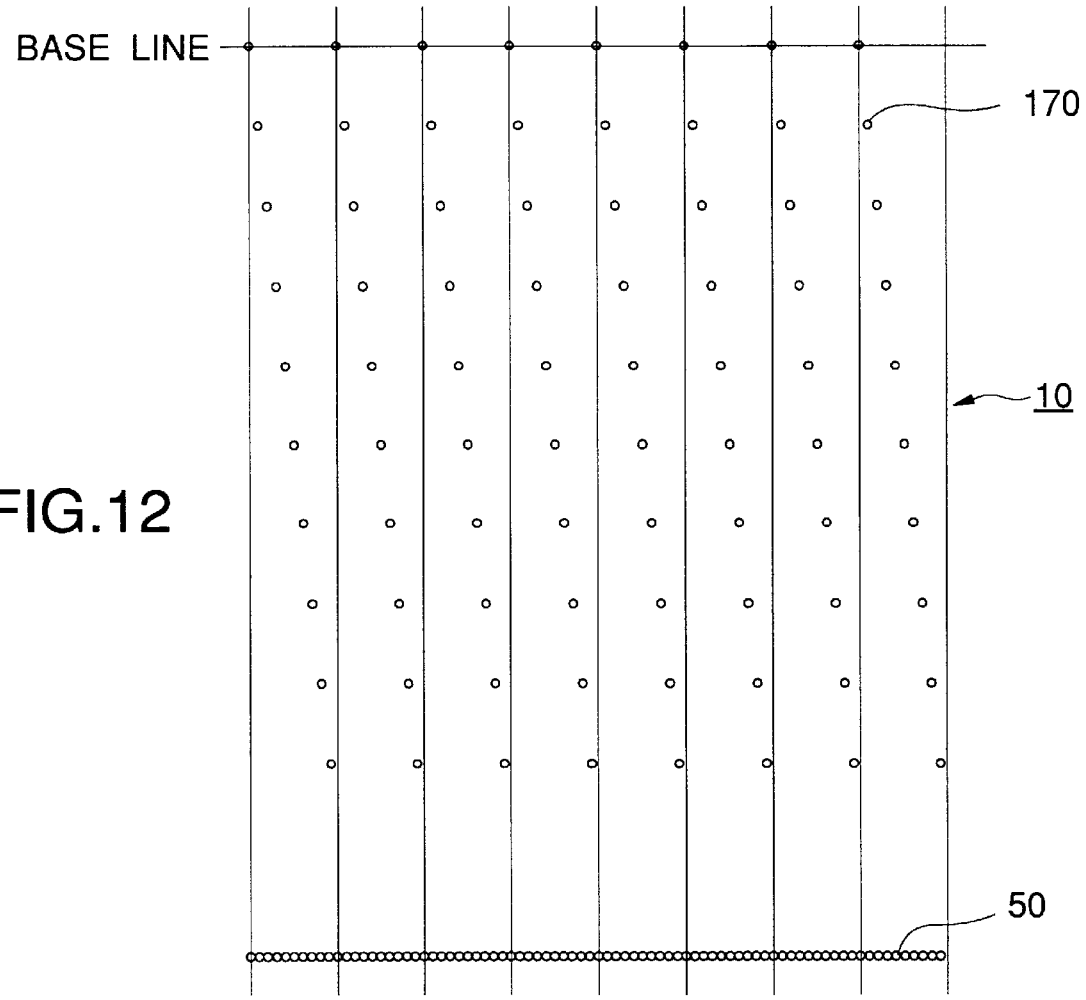
FIG. 12 is an illustration to show another embodiment of a laser light emission opening pattern of the two-dimensional surface emitting laser array of the invention.

FIG. 12 shows a basic layout (10 vertical spots) and assumes 10 base lines extending in the main scanning direction, one of which is the base line shown. Laser openings 170 are made on the shown base line in the shown spacing, thereby forming a first one-dimensional laser array. Laser openings 170 are made on the next base line (not shown) extending in parallel with the shown base line shifted in the main scanning direction by a distance equal to the diameter of the opening 170, thereby forming a second one-dimensional laser array. Third to tenth one-dimensional laser arrays are formed in a similar manner. The first to tenth one-dimensional laser arrays provide a two-dimensional surface emitting laser array 10.

When the two-dimensional surface emitting laser array 10 is driven by a drive circuit shown in FIG. 5, for example, and the photosensitive body (not shown) is moved (rotated) in the sub scanning direction at a speed responsive to the drive timing for each base line, a pixel array densely placed with no space in the main scanning direction, as indicated by reference numeral 50, is provided on the photosensitive body. Although the pixel array 50 is shown at equal scaling in both main and sub scanning directions in FIG. 12, preferably it is enlarged in the main scanning direction at a first predetermined magnification and is enlarged at a second predetermined magnification smaller than the first predetermined magnification or reduced in the sub scanning direction, as described above. According to the basic layout pattern of the laser array 10, the laser openings 170 are equally spaced from each other, thus simplifying the pattern and facilitating manufacturing the laser array 10.

(b) Combination of square grids

Figure 13:
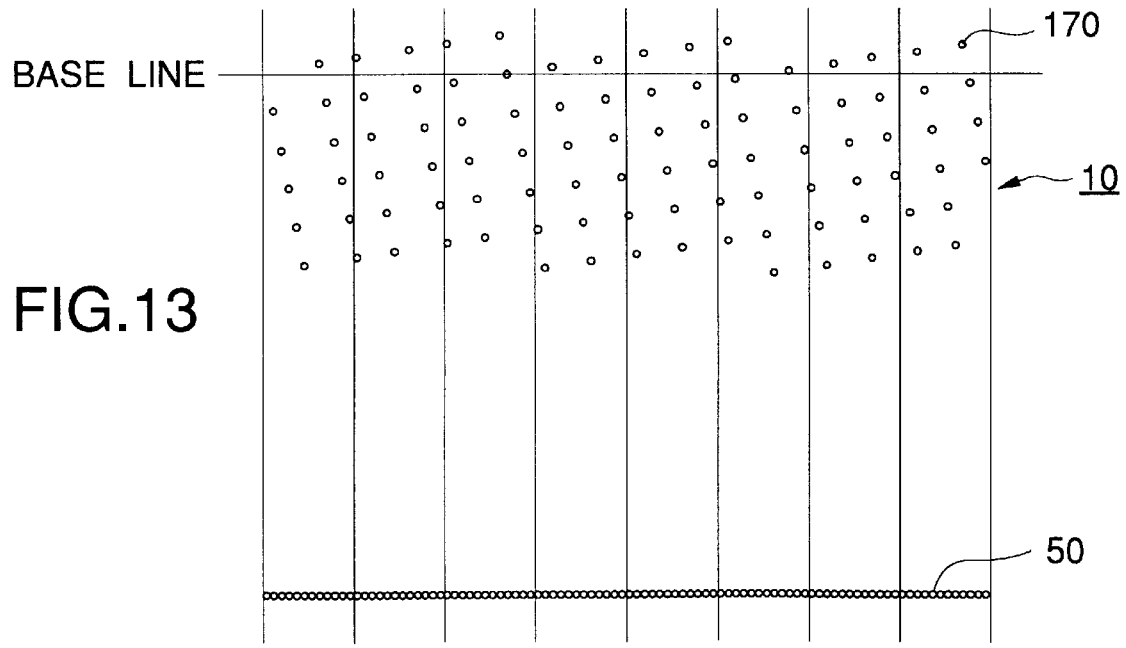
FIG. 13 is an illustration to show another embodiment of a laser light emission opening pattern of the two-dimensional surface emitting laser array of the invention.

FIG. 13 shows a two-dimensional surface emitting laser array 10 based on a combination of square grids. A 6×6-element square grid of laser openings 170 is used as a unit and the units are inclined at a predetermined angle with respect to the base line, thereby providing a two-dimensional surface emitting laser array. Reference numeral 50 shown at the bottom of the figure denotes a pixel array 50 formed on a photosensitive body. According to the pattern of the laser array 10, the square grids are used as the units, thus the pattern is the simplest and the laser array 10 is manufactured accurately.

(c) Registration spots (No.1)

Figure 14:
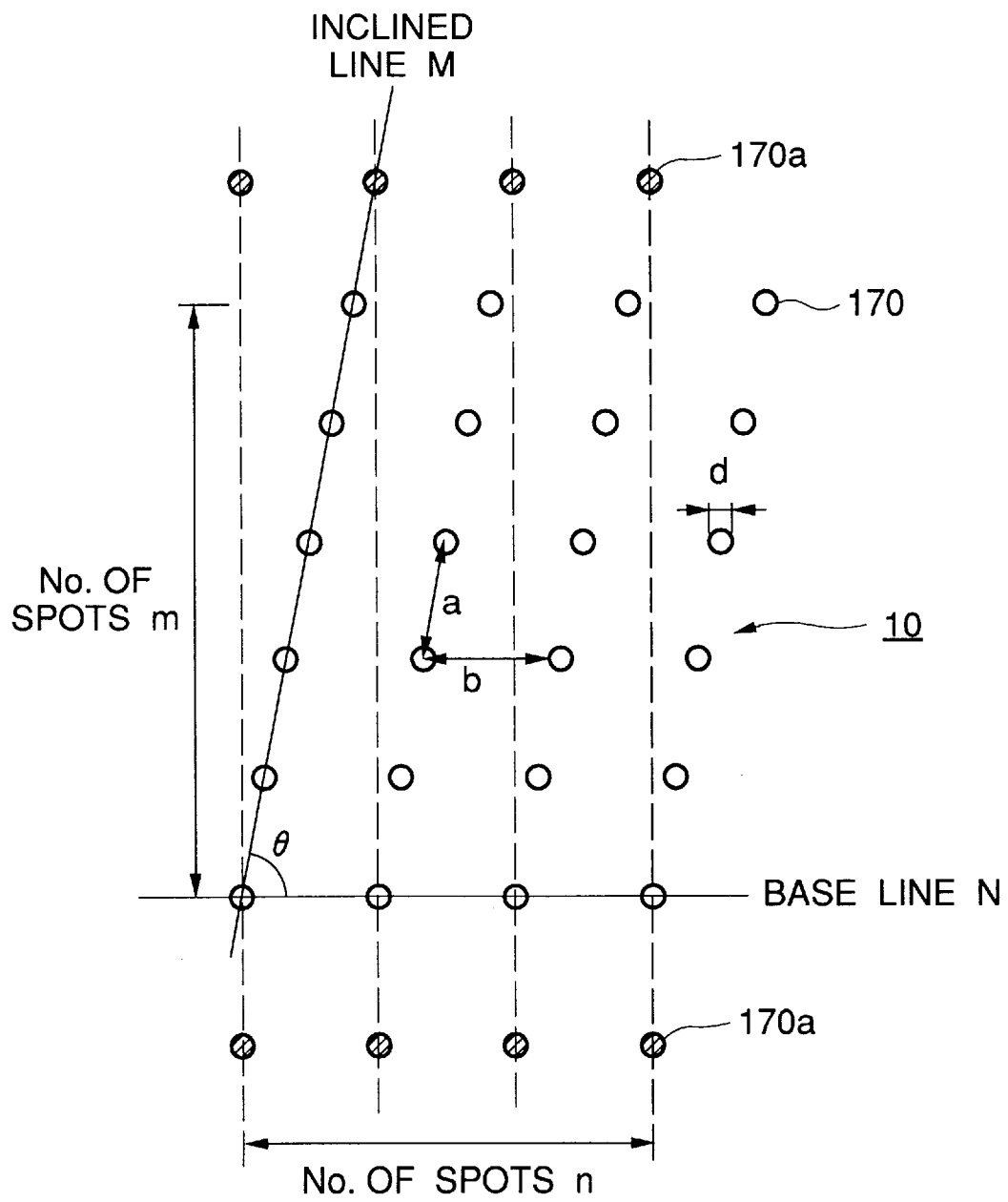
FIG. 14 is an illustration to show another embodiment of a laser light emission opening pattern of the two-dimensional surface emitting laser array of the invention.

FIG. 14 shows a two-dimensional surface emitting laser array 10 comprising a plurality of registration laser openings 170a placed above and below the image formation laser openings 170. In the figure, the inclined line M, the base line N, the numbers of laser openings m and n, the angle θ between the inclined line M and the base line N, the spacings between the laser openings 170, a and b, and the diameter d of the laser opening 170 are identical with those previously described with reference to FIG. 4, etc., and therefore will not be discussed again.

According to the registration laser openings 170a, a relative inclination of the two-dimensional surface emitting laser array 10 with the photosensitive body can be detected and high-quality images can be recorded.

(d) Registration spots (No.2)

Figure 15:
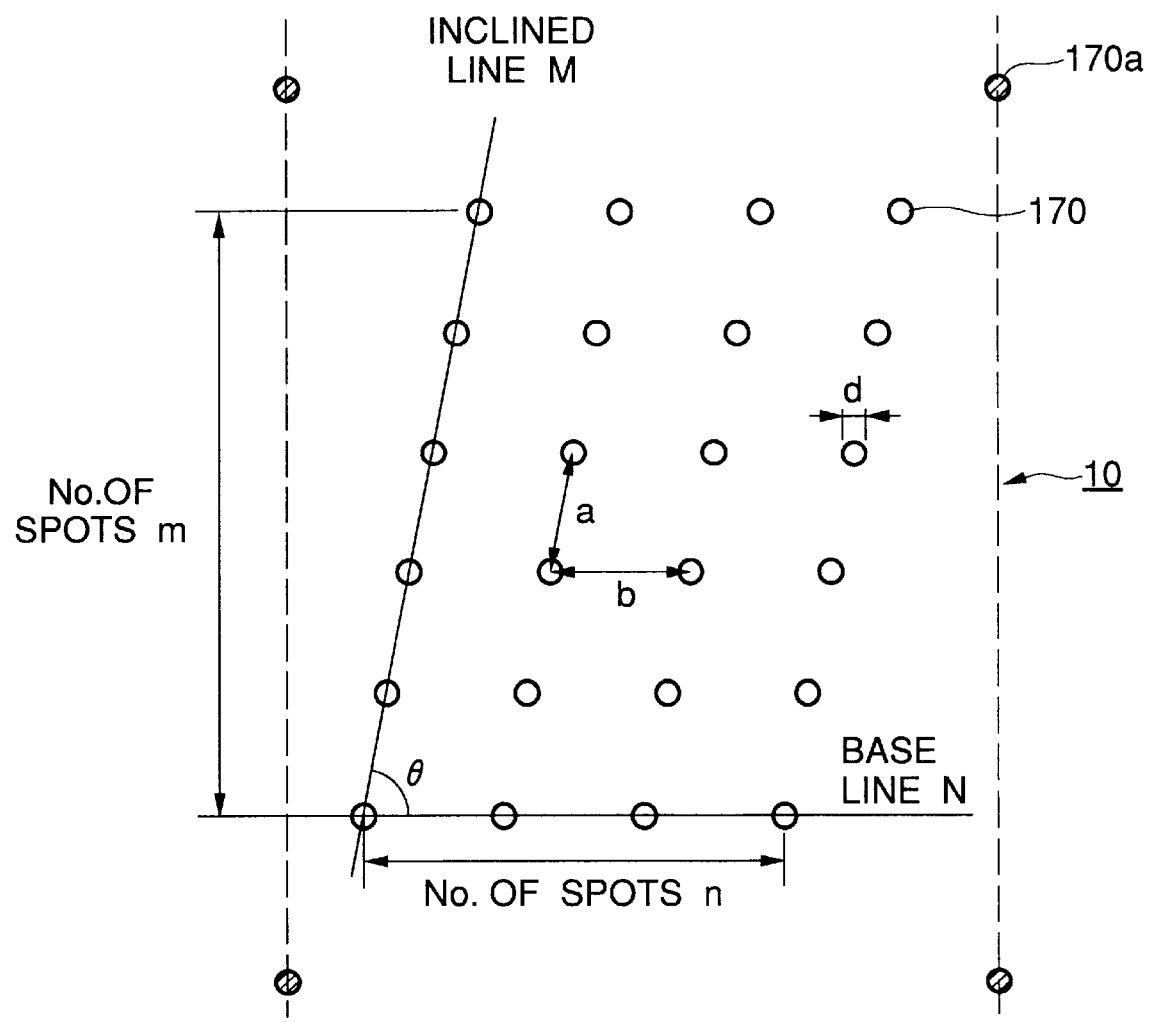
FIG. 15 is an illustration to show another embodiment of a laser light emission opening pattern of the two-dimensional surface emitting laser array of the invention.

FIG. 15 shows a two-dimensional surface emitting laser array 10 with registration laser openings 170a widely spaced from each other while the number thereof is decreased as compared with the two-dimensional surface emitting laser array 10 in FIG. 14.

(e) Registration spots (No.3)

Figure 16:
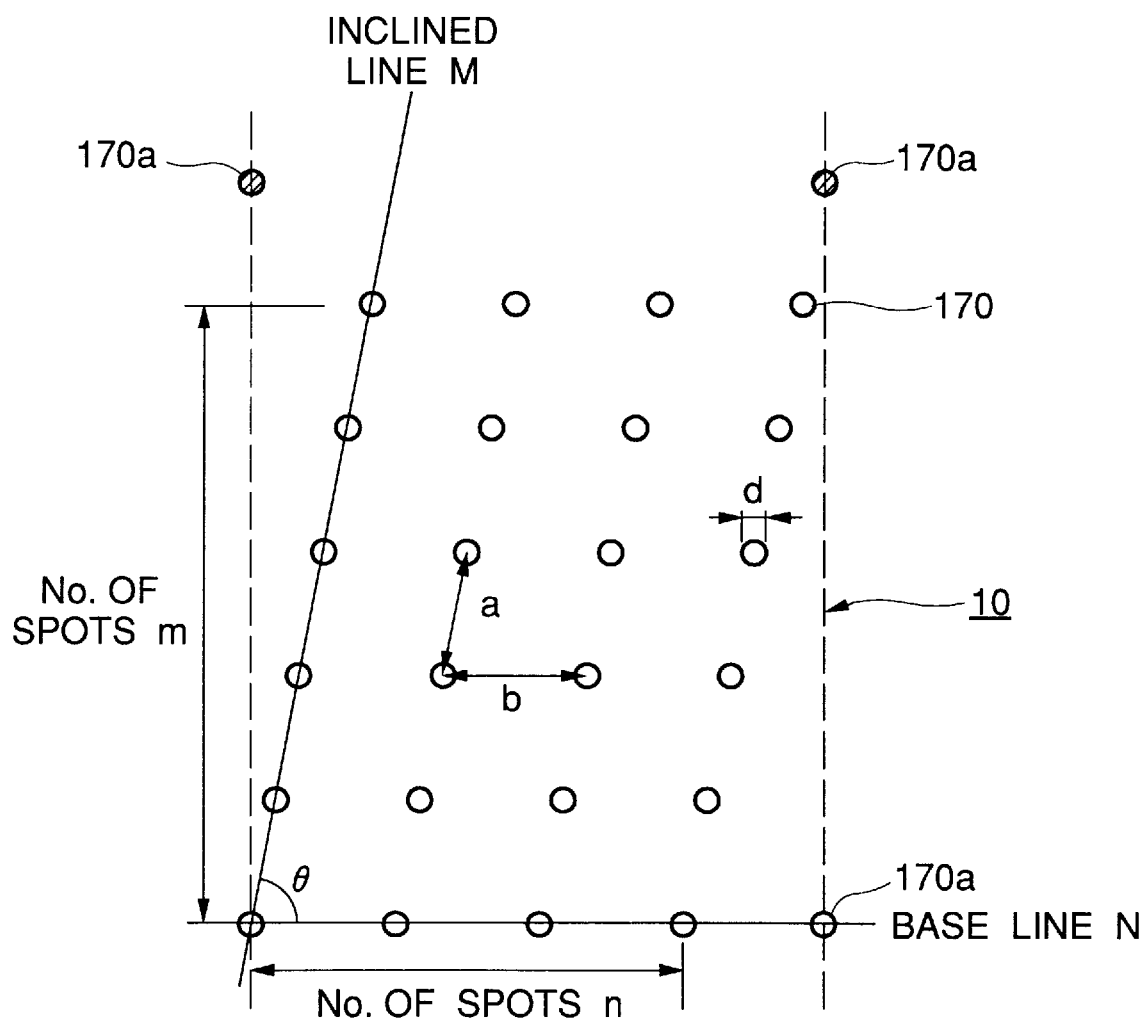
FIG. 16 is an illustration to show another embodiment of a laser light emission opening pattern of the two-dimensional surface emitting laser array of the invention.

FIG. 16 shows a two-dimensional surface emitting laser array 10 with the number of registration laser openings 170a decreased less than that of the two-dimensional surface emitting laser array 10 in FIG. 15. In the two-dimensional surface emitting laser array 10 in FIG. 16, one registration laser opening 170a is placed on the base line N along the image formation laser openings 170.

(f) 1-line spare spots

Figure 17:
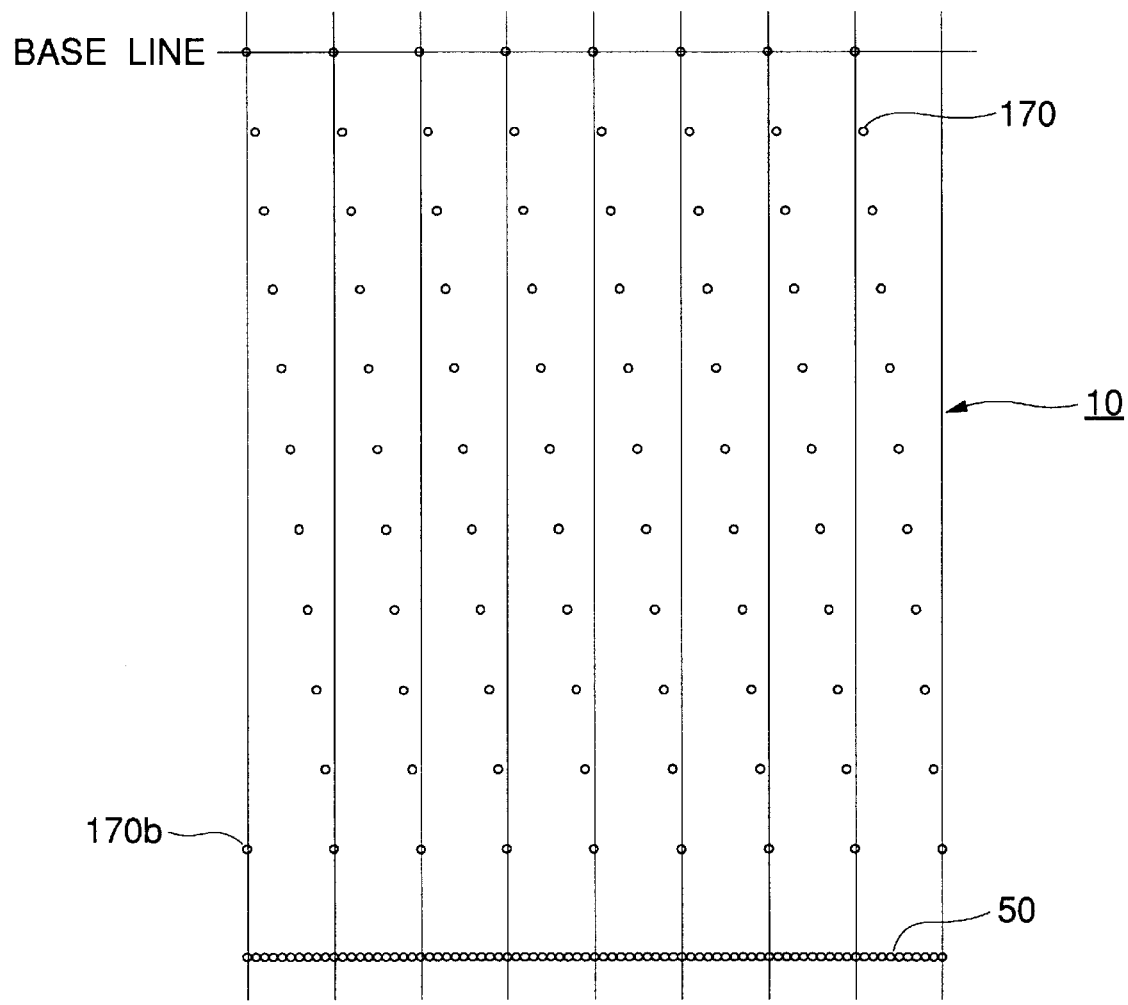
FIG. 17 is an illustration to show another embodiment of a laser light emission opening pattern of the two-dimensional surface emitting laser array of the invention.

FIG. 17 shows a two-dimensional surface emitting laser array 10 comprising one line of spare laser openings 170b and the basic layout pattern in FIG. 12. The spare laser openings 170b are placed at the same spacing as that of the image formation laser openings 170 in the main scanning direction. According to the two-dimensional surface emitting laser array 10 in FIG. 17, if one laser becomes faulty, its corresponding spare laser is driven at controlled drive timing, whereby missing pixels caused by the faulty laser can be prevented. The spare lasers 170b can also be used as registration spots.

(g) Two-dimensional spare spots

Figure 18:
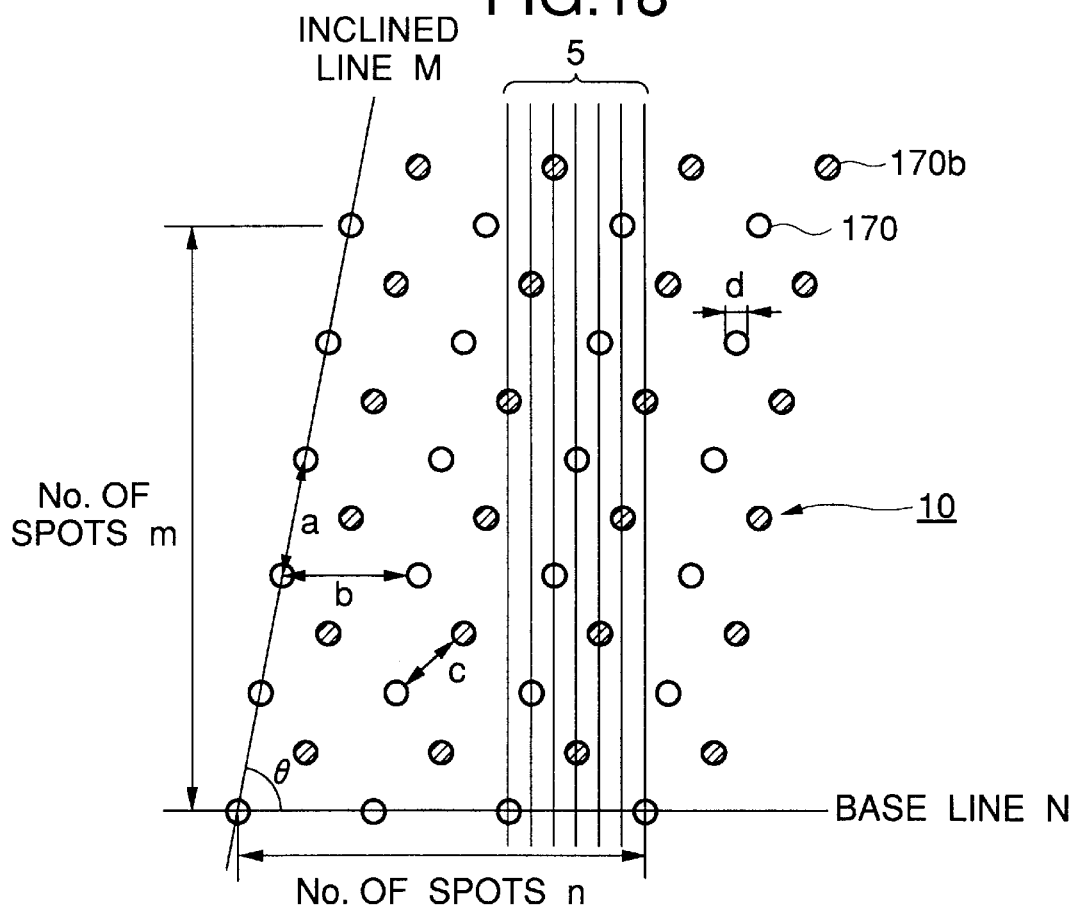
FIG. 18 is an illustration to show another embodiment of a laser light emission opening pattern of the two-dimensional surface emitting laser array of the invention.

FIG. 18 shows a two-dimensional surface emitting laser array 10 comprising spare laser openings 170b adjacent to image formation laser openings 170. The correspondence between faulty lasers and spare lasers is determined with sub scanning lines 5 as the reference. That is, when one laser becomes faulty, a spare laser placed on the same sub scanning line 5 as the faulty laser is driven at controlled drive timing, whereby the laser array 10 operates as if laser light were emitted through the faulty laser opening 170. Thus, missing pixels caused by the faulty laser can be prevented.

(h) Turned pattern

Figure 19:
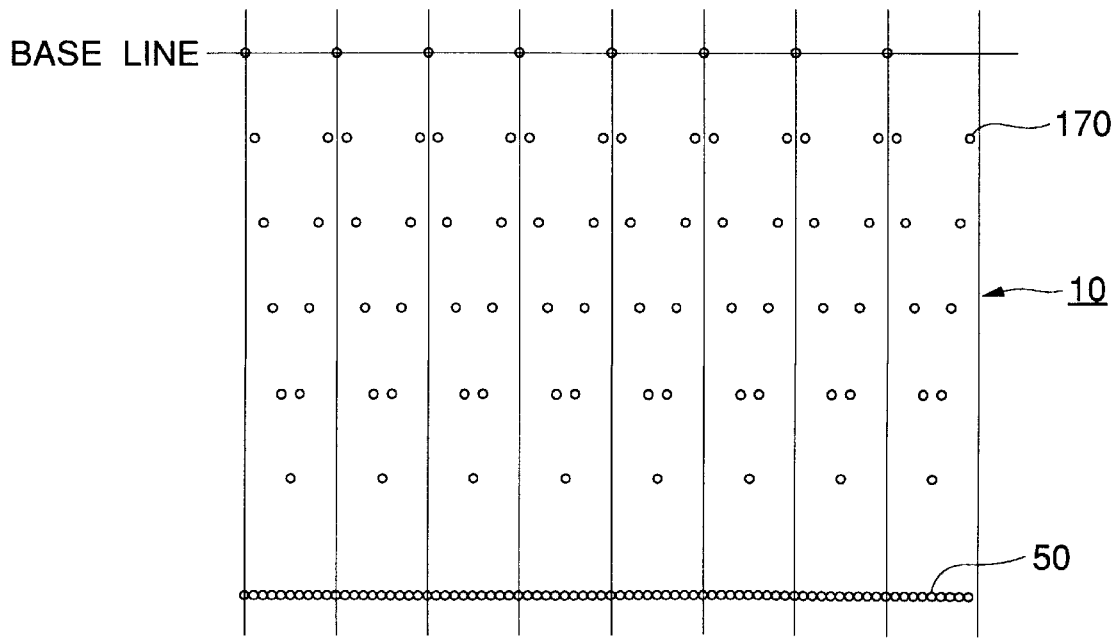
FIG. 19 is an illustration to show another embodiment of a laser light emission opening pattern of the two-dimensional surface emitting laser array of the invention.

FIG. 19 shows a two-dimensional surface emitting laser array 10 comprising image formation laser openings 170 made in a turned pattern at predetermined intervals with respect to the main scanning direction. According to the laser array 10, if the laser array 10 is inclined or rotated relative to a predetermined attachment position, displacement from a predetermined sub scanning line of pixels formed on a photosensitive body can be lessened.

(i) Turned pattern with shift (No.1)

Figure 20:
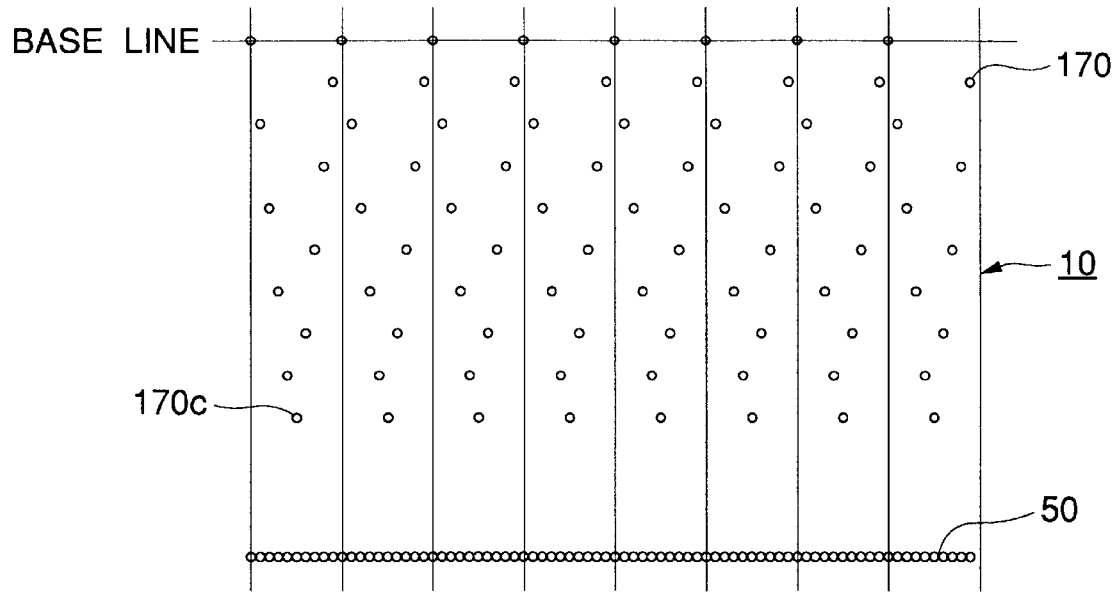
FIG. 20 is an illustration to show another embodiment of a laser light emission opening pattern of the two-dimensional surface emitting laser array of the invention.

FIG. 20 shows a two-dimensional surface emitting laser array 10 provided by shifting the image formation laser openings 170c after the turning point in the two-dimensional surface emitting laser array 10 of the turned pattern in FIG. 19. According to the laser array 10 in FIG. 20, in addition to the effect of the laser array 10 in FIG. 19, openings 170 are prevented from being close to each other at the turning point, preventing becoming hard to manufacture the laser array 10.

(j) Turned pattern with shift (No.2)

Figure 21:
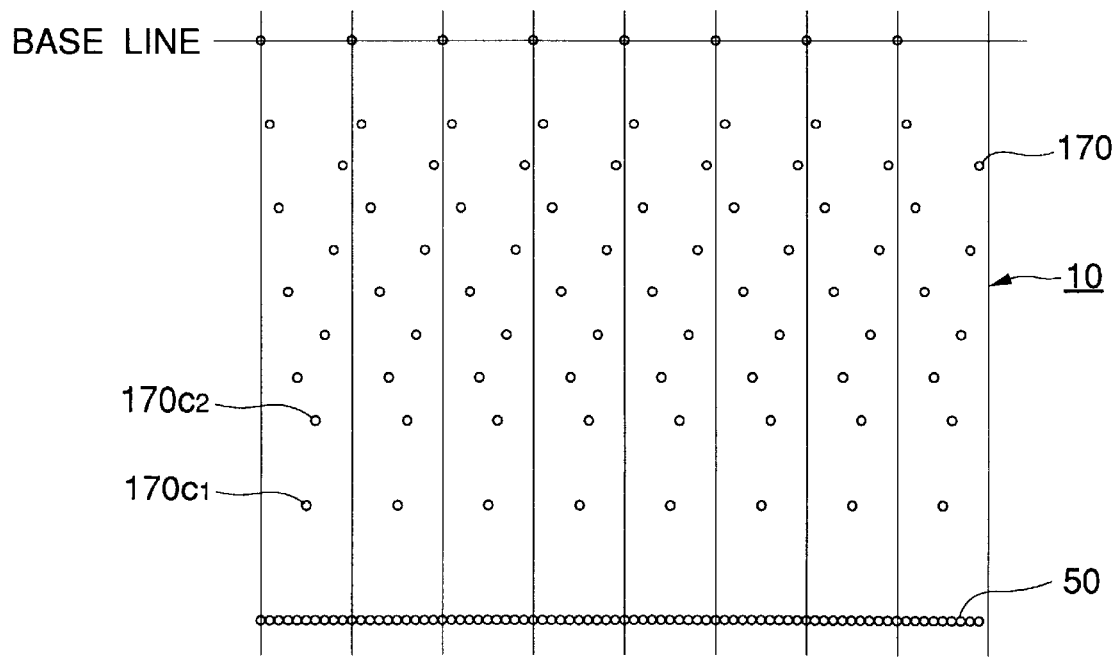
FIG. 21 is an illustration to show another embodiment of a laser light emission opening pattern of the two-dimensional surface emitting laser array of the invention.

FIG. 21 shows a two-dimensional surface emitting laser array 10 provided by increasing the positional shift amounts of the image formation laser openings 170c1 and 170c2 after the turning point in the two-dimensional surface emitting laser array 10 of the turned pattern with shift in FIG. 20. The same effect as the laser array 10 in FIG. 20 can be produced.

(k) 2-spot pattern (No.1)

Figure 22:
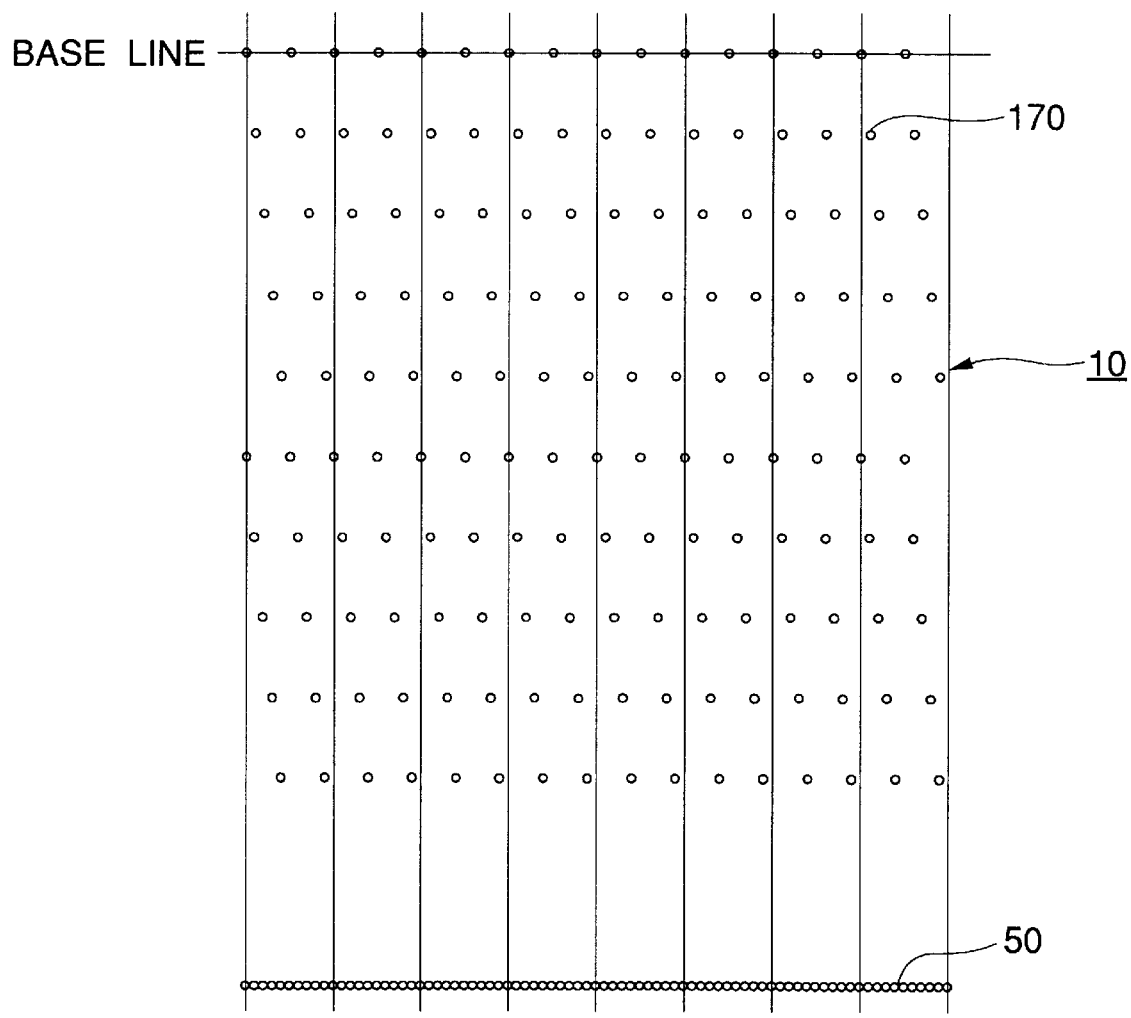
FIG. 22 is an illustration to show another embodiment of a laser light emission opening pattern of the two-dimensional surface emitting laser array of the invention.

FIG. 22 shows a two-dimensional surface emitting laser array 10 comprising two image formation laser openings 170 made per sub scanning line. According to the laser array 10, the image formation speed can be doubled. On the other hand, when the image formation speed is not doubled, the laser openings may be used as spare spots.

(l) 2-spot pattern (No.2)

Figure 23:
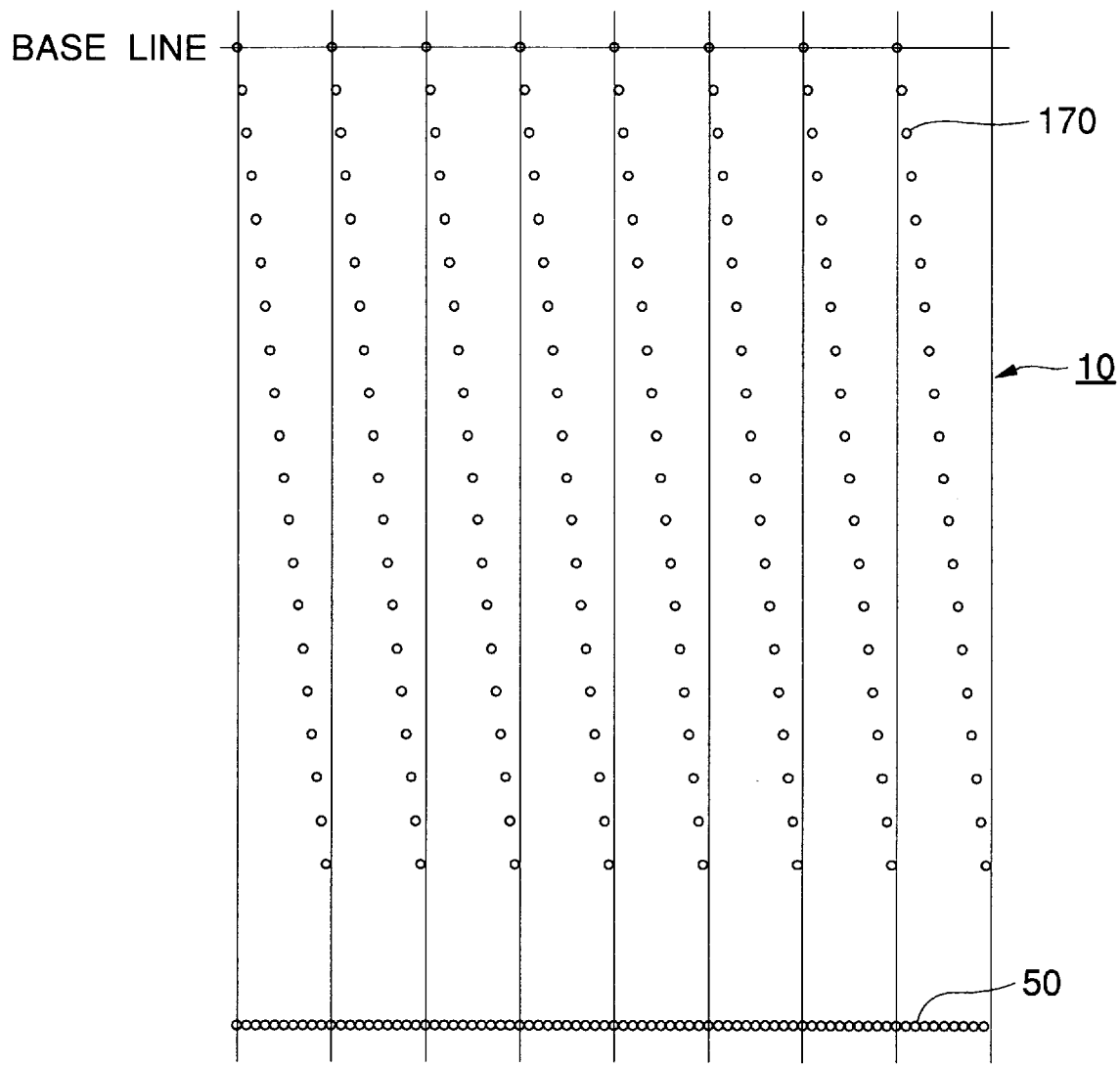
FIG. 23 is an illustration to show another embodiment of a laser light emission opening pattern of the two-dimensional surface emitting laser array of the invention.

FIG. 23 shows a two-dimensional surface emitting laser array 10 comprising two image formation laser openings 170 placed adjacent to each other on each sub scanning line. According to the laser array 10, when one of the laser openings is used as a spare laser opening, displacement from a predetermined sub scanning line of pixels formed by the spare laser caused by rotation of the laser array can be lessened in addition to the effect of the laser array 10 in FIG. 22.

(m) Turned pattern with shift having registration spots

Figure 24:
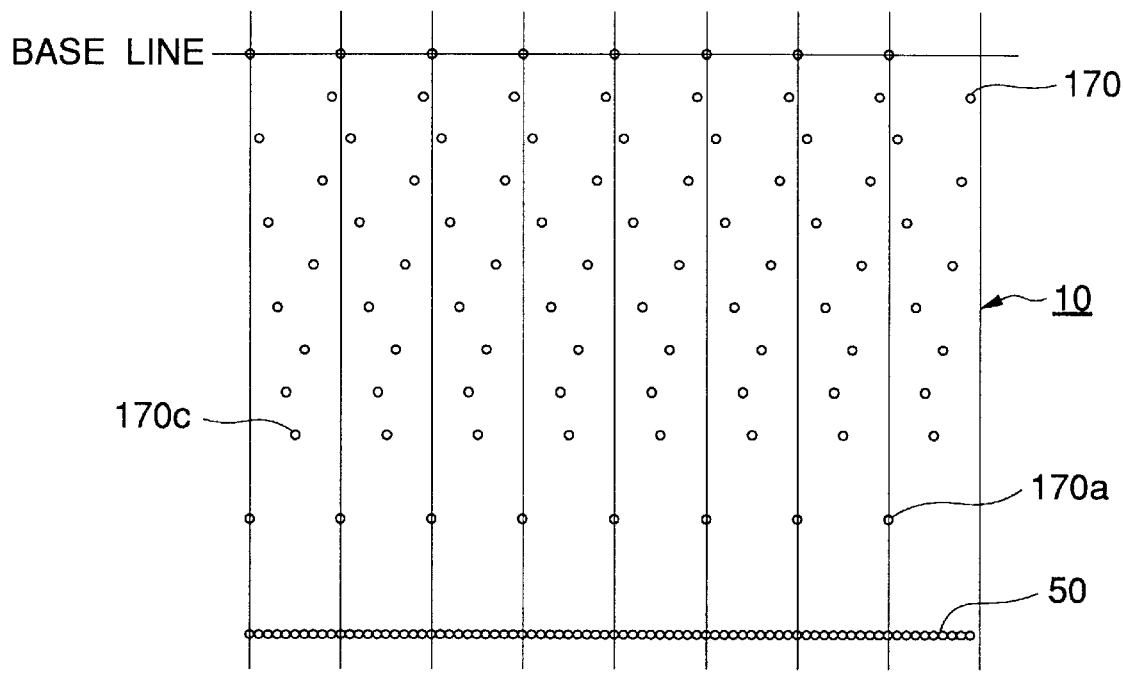
FIG. 24 is an illustration to show another embodiment of a laser light emission opening pattern of the two-dimensional surface emitting laser array of the invention.

FIG. 24 shows a two-dimensional surface emitting laser array 10 based on a turned pattern with shift having registration spots 170a. Numeral 170c is an opening with shift described above. According to the laser array 10, the effects of registration, shift, and turn can be produced at the same time.

(n) Turned pattern with shift having two spots

Figure 25:
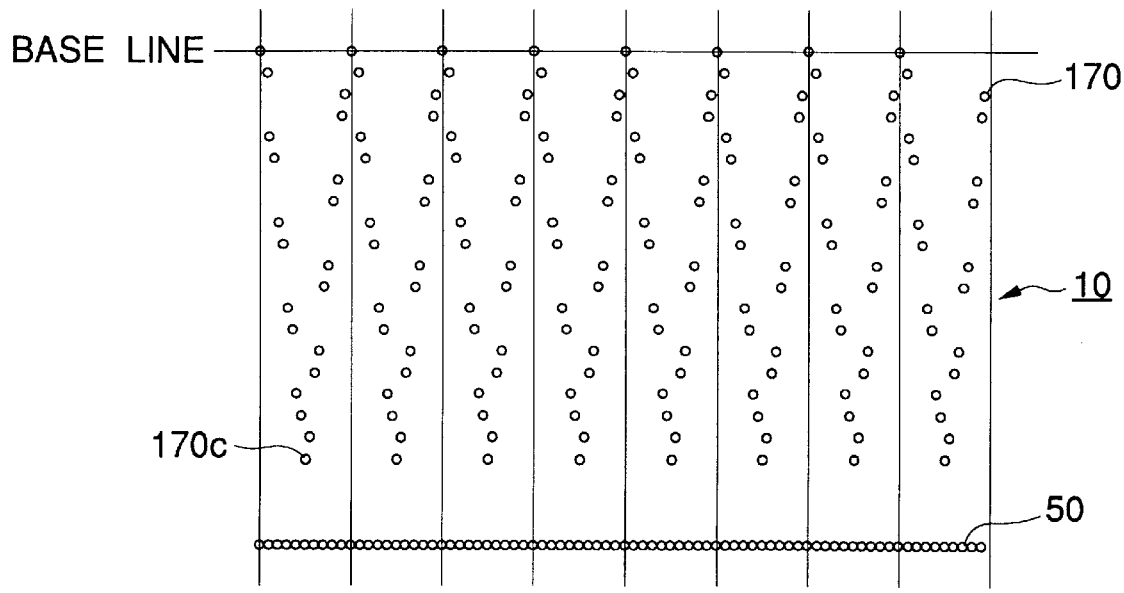
FIG. 25 is an illustration to show another embodiment of a laser light emission opening pattern of the two-dimensional surface emitting laser array of the invention.

FIG. 25 shows a two-dimensional surface emitting laser array 10 comprising two image formation laser openings 170 made on each sub scanning line and the openings 170c shifted after the turning point in a turned pattern. According to the laser array 10, the effects of 2-spot, shift, and turn can be produced at the same time.

EXAMPLES

The two-dimensional surface emitting laser beam recorder using the two-dimensional surface emitting laser arrays discussed above was executed under the following conditions:

(1) Examples when magnifications in the main and sub scanning directions in the optical system were made equal are shown in Table 1.

TABLE 1

| | Pattern | | | | |
|---|---|---|---|---|---|
| Parameter | Basic layout | Basic layout | 2-spot pattern | Turned pattern | Turned pattern |
| Resolution (dpi) | 300 | 1200 | 300 | 300 | 1200 |
| No. of spots n | 120 | 480 | 1800 | 225 | 450 |
| No. of spots m | 30 | 30 | 2 | 8 + 8 | 16 + 16 |
| No. of spots n × m | 3600 | 14400 | 3600 | 3600 | 14400 |
| Base line angle θ (°) | 88.1 | 88.1 | 63.4 | 86.4 | 88.2 |
| Spot diameter d ($\mu$m) | 5 | 2.5 | 10 | 5 | 5 |
| Spot spacing a ($\mu$m) | 150 | 75 | 20 | 80 | 160 |
| Spot spacing b ($\mu$m) | 150 | 75 | 22 | 80 | 160 |
| Spot spacing c ($\mu$m) | — | — | — | 40 | 80 |
| Array size in main scanning direction (mm) | 18 | 36 | 36 | 18 | 72 |
| Array size in sub scanning direction (mm) | 4.5 | 2.25 | 0.04 | 0.64 | 2.5 |
| Magnification in main scanning direction | 17 | 8.5 | 8.5 | 17 | 4.2 |

TABLE 1-continued

| Parameter | Pattern | | | | |
|---|---|---|---|---|---|
| | Basic layout | Basic layout | 2-spot pattern | Turned pattern | Turned pattern |
| Magnification in sub scanning direction (times) | 17 | 8.5 | 8.5 | 17 | 4.2 |
| Image size in main scanning direction (min) | 305 | 305 | 305 | 305 | 305 |
| Image size in sub scanning direction (mm) | 76 | 19 | 0.3 | 11 | 11 |

(2) Examples when in the optical system, magnification in the sub scanning direction was made smaller than that in the main scanning direction or reduction was made in the sub scanning direction, are shown in Table 2.

TABLE 2

| Parameter | Pattern | | | | | |
|---|---|---|---|---|---|---|
| | Basic layout | Basic layout | Basic layout | 2-spot pattern | Turned pattern | Turned pattern |
| Resolution (dpi) | 300 | 1200 | 300 | 300 | 300 | 1200 |
| No. of spots n | 120 | 480 | 120 | 1800 | 225 | 450 |
| No. of spots m | 30 | 30 | 30 | 2 | 8 + 8 | 16 + 16 |
| No. of spots n × m | 3600 | 14400 | 3600 | 3600 | 3600 | 14400 |
| Base line angle θ (°) | 88.1 | 88.1 | 88.1 | 63.4 | 86.4 | 88.2 |
| Spot diameter d (μm) | 5 | 2.5 | 5 | 10 | 5 | 5 |
| Spot spacing a (μm) | 150 | 75 | 150 | 20 | 80 | 160 |
| Spot spacing b (μm) | 150 | 75 | 150 | 22 | 80 | 160 |
| Spot spacing c (μm) | — | — | — | — | 40 | 80 |
| Array size in main scanning direction (mm) | 18 | 36 | 18 | 36 | 18 | 72 |
| Array size in sub scanning direction (mm) | 4.5 | 2.25 | 4.5 | 0.04 | 0.64 | 2.5 |
| Magnification in main scanning direction (times) | 17 | 8.5 | 17 | 8.5 | 17 | 4.2 |
| Magnification in sub scanning direction (times) | 8.5 | 4.25 | 0.564 | 4.25 | 8.5 | 2.1 |
| Image size in main scanning direction (mm) | 305 | 305 | 305 | 305 | 305 | 305 |
| Image size in sub scanning direction (mm) | 38 | 9.5 | 2.54 | 0.15 | 5.5 | 5.5 |

As we have discussed, according to the invention, the following effects can be produced:

(1) Since the need for a scan mirror is eliminated, failure occurrence can be suppressed and noise can be prevented.

(2) A plurality of lasers equally spaced from each other on at least two main scanning lines are formed on a semiconductor substrate and laser light emitted from the lasers is enlarged in the main scanning direction and is enlarged or reduced in the sub scanning direction. Thus, image recording based on a pixel array with no space at least in the main scanning direction can be executed.

(3) A two-dimensional surface emitting laser array is formed on a single semiconductor substrate for eliminating the need for combining semiconductor substrates. Thus, a pixel array can be formed with high position accuracy.

What is claimed is:

1. A two-dimensional surface emitting laser array comprising:
    a substrate;
    a first laser array having a plurality of lasers placed in a first spacing along a first base line extending in a main scanning direction on said substrate; and
    at least a second laser array having a plurality of lasers placed along at least a second base line having a second spacing with the first base line in the sub scanning direction and extending in parallel with the first base line on said substrate, wherein
    the lasers of said first laser array and the lasers of at least said second laser array are placed at different positions in the main scanning direction along the first base line and at least the second base line so as to form an array of pixels equally spaced from each other and with no gap in the main scanning direction.

2. The two-dimensional surface emitting laser array of claim 1, wherein
    said first laser array and at least said second laser array include:
        registration lasers to adjust the relative position between an emission face of laser light emitted from the lasers of said first laser array and the lasers of at least said second laser array, and an exposure face of a photosensitive body exposed to the laser light.

3. The two-dimensional surface emitting laser array of claim 1, further comprising:
    registration lasers to adjust a relative position between an emission face of laser light emitted from the lasers of said first laser array and the lasers of at least said second laser array, and an exposure face of a photosensitive body exposed to the laser light.

4. The two-dimensional surface emitting laser array of claim 1, wherein
    when at least one laser becomes defective, said first laser array and at least said second laser array include:
        a spare laser with which the defective laser is replaced.

5. The two-dimensional surface emitting laser array of claim 1, wherein
    when at least one laser becomes defective, said first laser array and at least said second laser array further include:
        a spare laser with which the defective laser is replaced.

6. The two-dimensional surface emitting laser array of claim 1, wherein
    said first laser array and at least said second laser array comprise:
        a plurality of lasers placed on a line orthogonal to the first base line.

7. A two-dimensional surface emitting laser array comprising:
    a substrate;
    a first laser array having a plurality of lasers placed in a first spacing along a first base line on said substrate; and
    at least a second laser array having a plurality of lasers placed along a plurality of inclined lines crossing the first base line at a predetermined angle on the substrate, wherein the lasers of said first laser array and the lasers of at least said second laser array are placed so as to form an array of pixels equally spaced from each other and with no gap in the direction of the first base line.

8. A two-dimensional surface emitting laser beam scanner comprising:

a substrate;

a two-dimensional surface emitting laser array having a plurality of lasers placed two-dimensionally on said substrate, the two-dimensional surface emitting laser array comprising a first laser array having a plurality of lasers placed in a first spacing along a first base line extending in the main scanning direction on said substrate, and at least a second laser array having a plurality of lasers placed along at least a second base line having a second spacing with the first base line in the sub scanning direction and extending in parallel with the first base line on said substrate, and wherein the lasers of said first laser array and the lasers of at least said second laser array are placed at different positions in the main scanning direction along the first base line and at least the second base line so as to form an array of pixels equally spaced from each other and with no gap in the main scanning direction;

a lens system being placed on the emission side of said two-dimensional surface emitting laser array and having a diameter for receiving all laser light emitted from the lasers; and means for driving the lasers of said two-dimensional surface emitting laser array in response to a specified scanning pattern.

9. The two-dimensional surface emitting laser beam scanner of claim 8, wherein said lens system comprises:

a first lens subsystem for enlarging laser light emitted from the lasers of said two-dimensional surface emitting laser array at a first magnification in the main scanning direction, and a second lens subsystem for enlarging laser light emitted from the lasers at a second magnification smaller than the first magnification in the sub scanning direction.

10. The two-dimensional surface emitting laser beam scanner of claim 8, wherein said lens system comprises:

a first lens subsystem for enlarging laser light emitted from the lasers of said two-dimensional surface emitting laser array at a first magnification in the main scanning direction, and a second lens subsystem for reducing laser light emitted from the lasers at a second magnification in the sub scanning direction.

11. A two-dimensional surface emitting laser beam recorder comprising:

a substrate;

a two-dimensional surface emitting laser array having a plurality of lasers placed two-dimensionally on said substrate, the two-dimensional surface emitting laser array comprising a first laser array having a plurality of lasers placed in a first spacing along a first base line extending in the main scanning direction on said substrate, and at least a second laser array having a plurality of lasers placed along at least a second base line having a second spacing with the first base line in the sub scanning direction and extending in parallel with the first base line on said substrate, and wherein the lasers of said first laser array and the lasers of at least said second laser array are placed at different positions in the main scanning direction along the first base line and at least the second base line so as to form an array of pixels equally spaced from each other and with no gap in the main scanning direction;

a lens system being placed on the emission side of said two-dimensional surface emitting laser array and having a diameter for receiving all laser light emitted from the lasers;

means for driving the lasers of said two-dimensional surface emitting laser array in response to a specified scanning pattern;

a photosensitive body rotating at a predetermined speed in the sub scanning direction and being exposed to the laser light passed through said lens system for forming an electrostatic latent image; and means for developing the electrostatic latent image formed on said photosensitive body.

12. The two-dimensional surface emitting laser beam recorder of claim 11, wherein said lens system comprises:

a first lens subsystem for enlarging laser light emitted from the lasers of said two-dimensional surface emitting laser array at a first magnification in the main scanning direction, and a second lens subsystem for enlarging laser light emitted from the lasers at a second magnification smaller than the first magnification in the sub scanning direction.

13. The two-dimensional surface emitting laser beam recorder of claim 11, wherein said lens system comprises:

a first lens subsystem for enlarging laser light emitted from the lasers of said two-dimensional surface emitting laser array at a first magnification in the main scanning direction, and a second lens subsystem for reducing laser light emitted from the lasers at a second magnification in the sub scanning direction.

14. A two-dimensional surface emitting laser beam recording method comprising the steps of:

preparing a two-dimensional surface emitting laser array having a plurality of lasers placed two-dimensional on a substrate, the two-dimensional surface emitting laser array comprising a first laser array having a plurality of lasers placed in a first spacing along a first base line extending in the main scanning direction on said substrate, and at least a second laser array having a plurality of lasers place along at least a second base line having a second spacing with the first base line in the sub scanning direction and extending in parallel with the first base line on said substrate, and wherein the lasers of said first laser array and the lasers of at least said second laser array are placed at different positions in the main scanning direction along the first base line and at least the second base line so as to form an array of pixels equally spaced from each other and with no gap in the main scanning direction;

driving the lasers of said two-dimensional surface emitting laser array in response to a specified scanning pattern for emitting laser light from the laser;

exposing a photosensitive body to the laser light through a lens system having a diameter for receiving all laser light emitted from the lasers for forming an electrostatic latent image on the photosensitive body in response to an exposure pattern; and developing the electrostatic latent image for preparing a visible image.

15. The two-dimensional surface emitting laser beam recording method of claim 14, wherein said electrostatic latent image is formed by enlarging the laser light at a first magnification in the main scanning direction by said lens system and enlarging the laser light at a second magnification smaller than the first magnification in the sub scanning direction by said lens system.

16. The two-dimensional surface emission laser beam recording method of claim 14, wherein said electrostatic latent image is formed by enlarging the laser light at a first magnification in the main scanning direction by said lens system and reducing the laser light at a second magnification in the sub scanning direction by said lens system.

* * * * *